(12) United States Patent
Kodaira et al.

(10) Patent No.: US 12,648,084 B2
(45) Date of Patent: Jun. 2, 2026

(54) SEMICONDUCTOR DEVICE

(71) Applicant: FUJI ELECTRIC CO., LTD.,
Kawasaki (JP)

(72) Inventors: Yoshihiro Kodaira, Matsumoto-city
(JP); Yusuke Sekino, Matsumoto-city
(JP); Taichi Itoh, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 488 days.

(21) Appl. No.: 18/182,833

(22) Filed: Mar. 13, 2023

(65) Prior Publication Data

US 2023/0345637 A1 Oct. 26, 2023

(30) Foreign Application Priority Data

Apr. 25, 2022 (JP) ................................. 2022-071801

(51) Int. Cl.
H05K 1/181 (2026.01)
H10W 90/00 (2026.01)
*H10W 72/00* (2026.01)

(52) U.S. Cl.
CPC ............ H05K 1/181 (2013.01); H10W 90/00
(2026.01); *H10W 72/884* (2026.01); *H10W*
*90/734* (2026.01); *H10W 90/753* (2026.01);
*H10W 90/754* (2026.01)

(58) Field of Classification Search
CPC ...................................................... H05K 1/181
USPC ........................................................ 361/784
See application file for complete search history.

(56) References Cited

U.S. PATENT DOCUMENTS

| | | | |
|---|---|---|---|
| 5,956,231 | A | 9/1999 | Yamada et al. |
| 2013/0307579 | A1* | 11/2013 | Wang ................... H03K 19/003 |
| | | | 326/16 |
| 2017/0170157 | A1* | 6/2017 | Masuda ................. H01L 24/49 |
| 2021/0351161 | A1 | 11/2021 | Iguchi |

FOREIGN PATENT DOCUMENTS

| | | |
|---|---|---|
| EP | 0706221 A2 | 4/1996 |
| JP | H05-235258 A | 9/1993 |
| JP | 2001-094035 A | 4/2001 |
| JP | 3222341 B2 | 10/2001 |

(Continued)

OTHER PUBLICATIONS

Office Action issued for corresponding Japanese patent application
No. 2022-071801, and its English translation, dated Apr. 28, 2026.

*Primary Examiner* — Stanley Tso
(74) *Attorney, Agent, or Firm* — Rabin & Berdo, P.C.

(57) ABSTRACT

A semiconductor device includes a first insulated circuit
board that is rectangular with first to fourth sides, including
a first input wiring board and a first output wiring board each
extending in a first direction parallel to the first side and
being adjacent to each other. The first output wiring board
includes a first output region electrically connected to a first
output terminal and a first connection wiring region electri-
cally connected to the output electrodes of the plurality of
first semiconductor chips and being closer to the second side
than is the first output region. The first connection wiring
region has a first slit extending in the first direction from an
end of the first connection wiring region at a side thereof
where the first output region is located.

23 Claims, 11 Drawing Sheets

(56)  References Cited

FOREIGN PATENT DOCUMENTS

| | | | |
|---|---|---|---|
| JP | 6405383 | B2 | 10/2018 |
| JP | 2021-177519 | A | 11/2021 |
| WO | 2016/009496 | A1 | 1/2016 |

* cited by examiner

SEMICONDUCTOR DEVICE

CROSS-REFERENCE TO RELATED APPLICATION

This application is based upon and claims the benefit of priority of the prior Japanese Patent Application No. 2022-071801, filed on Apr. 25, 2022, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power converter devices. The power device disclosed in this specification is a switching element. As examples, switching elements include insulated gate bipolar transistors (IGBTs) and power metal oxide semiconductor field effect transistors (MOSFETs). A semiconductor device includes a plurality of semiconductor chips including power devices, and an insulated circuit board. The insulated circuit board includes an insulating board and a wiring board, which is formed on a front surface of the insulating board and has the semiconductor chips bonded thereto. The plurality of semiconductor chips are connected in parallel on the wiring board. Output electrodes of the plurality of semiconductor chips and another wiring board are electrically connected by wires. Some or parts of these semiconductor chips, insulated circuit board, wires, and external connection terminals are housed inside a case, and the inside of the case is filled with an encapsulating member (see, for example, International Publication Pamphlet No. WO 2016/009496).

When a plurality of semiconductor chips are connected in parallel to a wiring board, currents will flow through the wiring board along the direction in which the plurality of semiconductor chips are laid out. Currents that flow in this way flow in order into input electrodes on the rear surfaces of the respective semiconductor chips, with currents being outputted from output electrodes on the front surfaces of the semiconductor chips. The outputted currents flow via wires to another wiring board. With this configuration, the length of the current path will differ for each of the plurality of semiconductor chips and differences in impedance will occur in keeping with these lengths. This means that current imbalances will occur between the plurality of semiconductor chips. When such current imbalances occur, the loss on each current path becomes uneven, which makes it difficult to extend the life of the semiconductor device.

SUMMARY OF THE INVENTION

According to one aspect of the present embodiments, there is provided a semiconductor device including: a plurality of first semiconductor chips, each including an input electrode on a rear surface and an output electrode on a front surface thereof; and a first insulated circuit board that is rectangular, and has a first side, a second side, a third side, and a fourth side in this order, the first insulated circuit board including a first input wiring board extending in a first direction parallel to the first and the third sides, and a first output wiring board extending in the first direction, being adjacent to the first input wiring board in a second direction perpendicular to the first direction and parallel to the second and fourth sides, and being closer to one of the first side or the third side of the first insulated circuit board than is the first input wiring board, wherein the first input wiring board includes a first input region electrically connected to an input terminal and a first chip bonding region to which the plurality of first semiconductor chips are bonded, the first input region being located closer to the fourth side of the first insulated circuit board than is the first chip bonding region, the first output wiring board includes a first output region electrically connected to a first output terminal and a first connection wiring region electrically connected to the output electrodes of the plurality of first semiconductor chips, the first output region being located closer to the fourth side of the first insulated circuit board than is the first connection wiring region, and the first connection wiring region has a first slit extending in the first direction from the first output region toward the second side of the first insulated circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
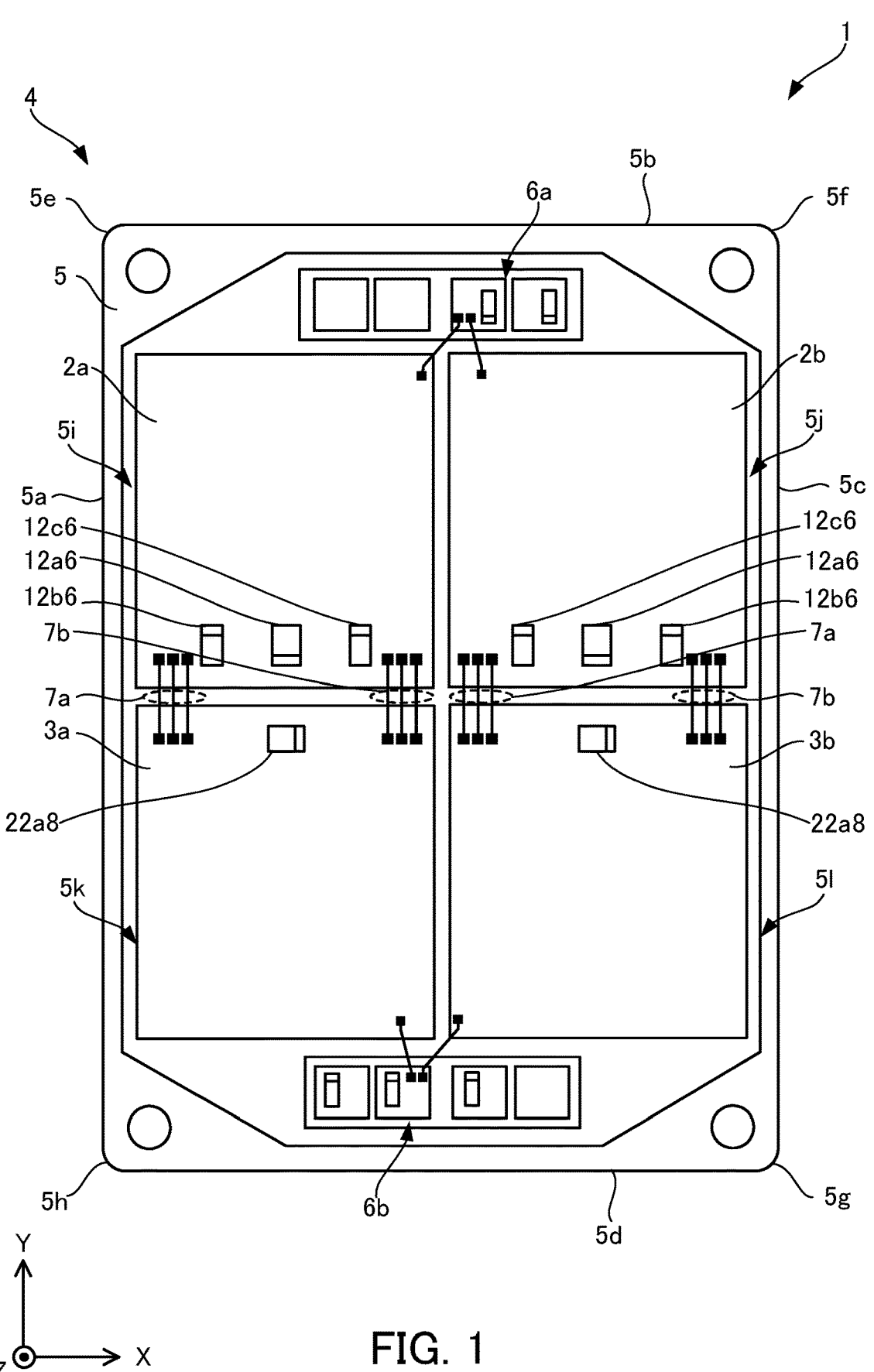
FIG. 1 is a plan view of a semiconductor device according to an embodiment.

An embodiment will be described below with reference to the accompanying drawings. Note that in the following description, the expressions "front surface" and "upper surface" refer to an X-Y plane that faces upward (in the "+Z direction") for a semiconductor device depicted in the drawings. In the same way, the expression "up" refers to the upward direction (or "+Z direction") for the semiconductor device 1 depicted in FIG. 1. The expressions "rear surface" and "lower surface" refer to an X-Y plane that faces downward (that is, in the "−Z direction") for the semiconductor device 1 depicted in FIG. 1. In the same way, the expression "down" refers to the downward direction (or "−Z direction") for the semiconductor device 1 depicted in FIG. 1. These expressions are used as needed to refer to the same directions in the other drawings. The expressions "front surface", "upper surface", "up", "rear surface", "lower surface", "down", and "side surface" are merely convenient expressions used to specify relative positional relationships, and are not intended to limit the technical scope of the present disclosure. As one example, "up" and "down" do not necessarily mean directions that are perpendicular to the ground. That is, the "up" and "down" directions are not limited to the direction of gravity. Additionally, in the following description, the expression "main component" refers to a component that composes 80% or higher by volume out of all the components.

A semiconductor device according to an embodiment will now be described with reference to FIG. 1. FIG. 1 is a plan view of the semiconductor device according to the embodiment. The semiconductor device 1 includes a housing 4, semiconductor units 2a, 2b, 3a, and 3b which are housed in the housing 4, and a heat-dissipating base plate 15. Note that the semiconductor units 2a, 2b, 3a, and 3b have been illustrated only in outline. The semiconductor units 2a, 2b, 3a, and 3b will be described in detail later in this specification. The heat-dissipating base plate 15 may be seen in FIGS. 3 and 5, which will be described later.

The housing 4 includes an outer frame 5 and control terminals 6a and 6b. The outer frame 5 is surrounded, in order, by a long side 5a, a short side 5b, a long side 5c, and a short side 5d. The outer frame 5 also includes corner portions 5e to 5h. The corner portion 5e is formed of the long side 5a and the short side 5b. The corner portion 5f is formed of the short side 5b and the long side 5c. The corner portion 5g is formed of the long side 5c and the short side 5d. The corner portion 5h is formed of the short side 5d and the long side 5a. The outer frame 5 includes unit housing regions 5i to 5l. The unit housing regions 5i to 5l are arranged in two rows and two columns. The unit housing regions 5i to 5l may have any shape and area capable of housing the semiconductor units 2a, 2b, 3a, and 3b, respectively. The thickness of the outer frame 5 (the long side 5a, the short side 5b, the long side 5c, and the short side 5d) is greater than the thickness of the semiconductor units 2a, 2b, 3a, and 3b, which will be described later.

Figure 3:
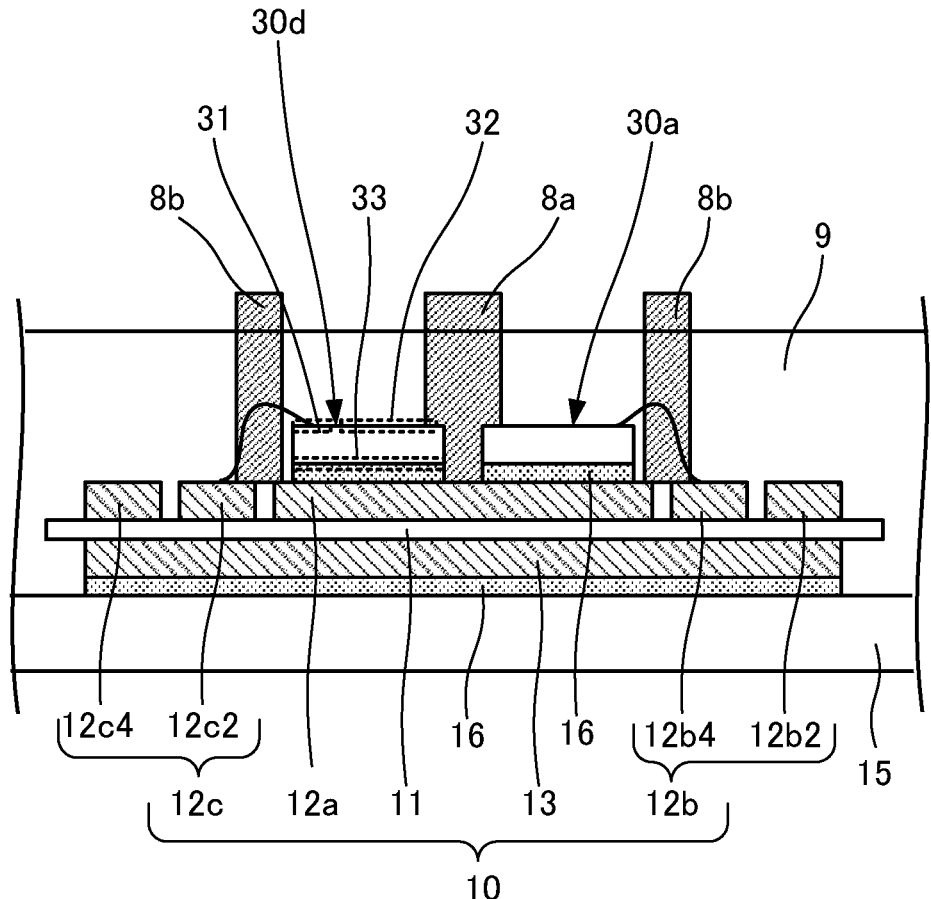
FIG. 3 is a cross-sectional view of the semiconductor unit (or "upper arm portion") included in the semiconductor device according to the present embodiment.
Figure 3:
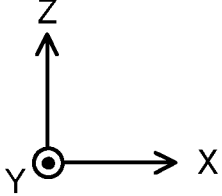
Figure 5:
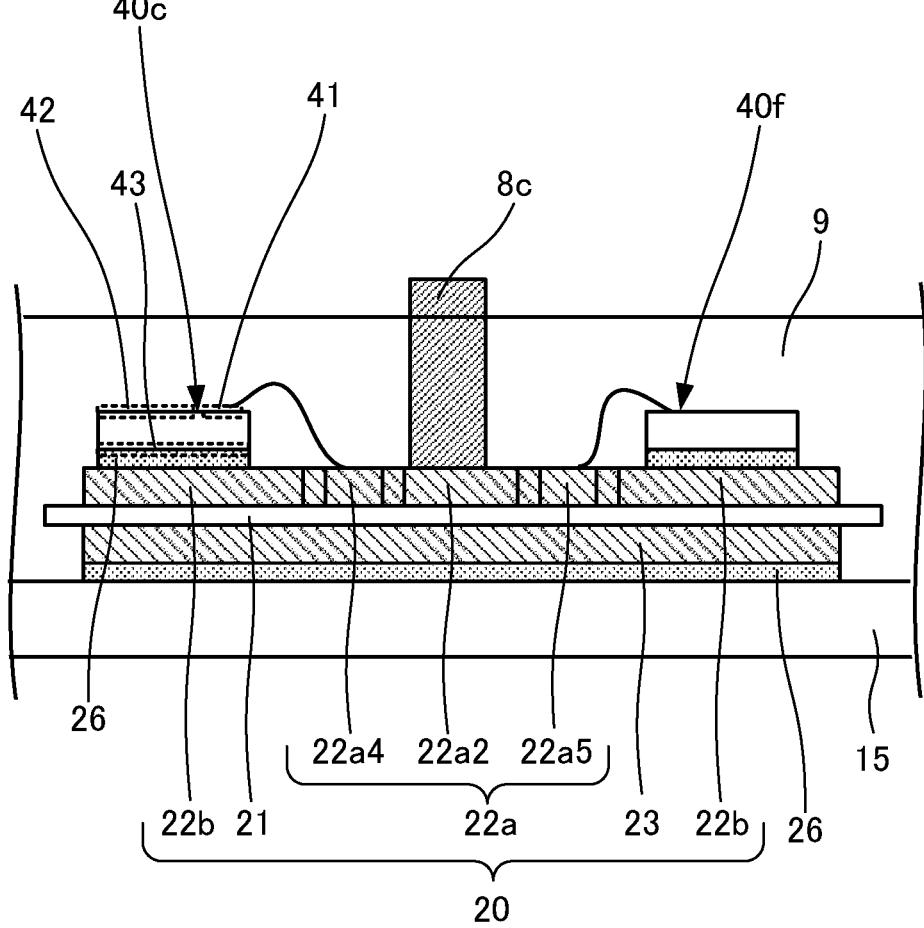
FIG. 5 is a cross-sectional view of a semiconductor unit (or "lower arm portion") included in the semiconductor device according to the present embodiment.

The insides of the unit housing regions 5i to 5l for housing the semiconductor units 2a, 2b, 3a, and 3b are encapsulated with an encapsulating member 9 (see FIGS. 3 and 5). When doing so, upper ends of external connection terminals 8a to 8c, which will be described later and are to be connected at positions of terminal bonding regions 12a6, 12b6, 12c6, and 22a8, extend from the encapsulating member 9 in the +Z direction. The encapsulating member 9 contains a thermosetting resin and a filler included in the thermosetting resin. Example thermosetting resins include epoxy resin, phenolic resin, and maleimide resin. Example fillers include glass, silicon dioxide, aluminum oxide, boron nitride, and aluminum nitride. One example of the encapsulating member 9 includes epoxy resin and filler. At least one of the fillers listed above is used as the filler.

The control terminals 6a and 6b are provided on the short sides 5b and 5d, respectively. When a control signal is applied from the outside, the control terminal 6a inputs the control signal into the semiconductor units 2a and 2b housed in the unit housing regions 5i and 5j. When a control signal is applied from the outside, the control terminal 6b inputs the control signal into the semiconductor units 3a and 3b housed in the unit housing regions 5k and 5l. The housing 4 may further include fastening holes at the corner portions 5e to 5h. The semiconductor device 1 is disposed at a predetermined region, with screws inserted through the fastening holes being fastened to the region in question. By doing so, the semiconductor device 1 is attached to the region in question.

The housing 4 including the control terminals 6a and 6b is formed by injection molding using a resin. Example resins include polyphenylene sulfide, polybutylene terephthalate resin, polybutylene succinate resin, polyamide resin, and acrylonitrile butadiene styrene resin.

The semiconductor units 2a and 2b construct an upper arm portion, and the semiconductor units 3a and 3b construct a lower arm portion. The semiconductor units 2a and 3a are aligned in the ±Y direction. The semiconductor units 2a and 3a are electrically connected by connecting wires 7a and 7b to form one phase of a power converter device. In the same way, the semiconductor units 2b and 3b are aligned in the ±Y direction. The semiconductor units 2b and 3b are electrically connected by the connecting wires 7a and 7b to form one phase of a power converter device.

The semiconductor unit 2a is provided with terminal bonding regions 12a6, 12b6, and 12c6 on the short side 5d side. The semiconductor unit 3a is provided with a terminal bonding region 22a8 on the short side 5b side. Accordingly, on the semiconductor units 2a and 3a, the terminal bonding regions 12a6, 12b6, 12c6, and 22a8 are provided at a boundary line (that is, near the boundary line) between the semiconductor units 2a and 3a. Likewise, the semiconductor unit 2b is provided with terminal bonding regions 12a6, 12b6, and 12c6 on the short side 5d side. The semiconductor unit 3b is provided with a terminal bonding region 22a8 on the short side 5b side. Accordingly, on the semiconductor units 2b and 3b, the terminal bonding regions 12a6, 12b6, 12c6, and 22a8 are provided at a boundary line (that is, near the boundary line) between the semiconductor units 2b and 3b. That is, the terminal bonding regions 12a6, 12b6, 12c6, and 22a8 are provided in central portions in the ±Y-direction of the semiconductor units 2a and 3a and the semiconductor units 2b and 3b. Doing so facilitates connection and wiring of external terminals to the terminal bonding regions 12a6, 12b6, 12c6, and 22a8.

The semiconductor units 2a and 3a and the semiconductor units 2b and 3b are disposed on the heat-dissipating base plate 15 with a bonding member 16 and a bonding member 26 disposed in-between. When doing so, the semiconductor units 2a, 2b, 3a, and 3b are arranged in two rows and two columns. The housing 4 is also attached to the heat-dissipating base plate 15 using an adhesive member. The semiconductor units 2a, 2b, 3a, and 3b are respectively housed in the unit housing regions 5i to 5l of the housing 4. The heat-dissipating base plate 15 may have the same shape and area as the external shape of the housing 4 in plan view. The heat-dissipating base plate 15 is formed of a material with superior thermal conductivity as a main component. Example materials include aluminum, iron, silver, copper, or an alloy containing at least one of these metals.

Figure 2:
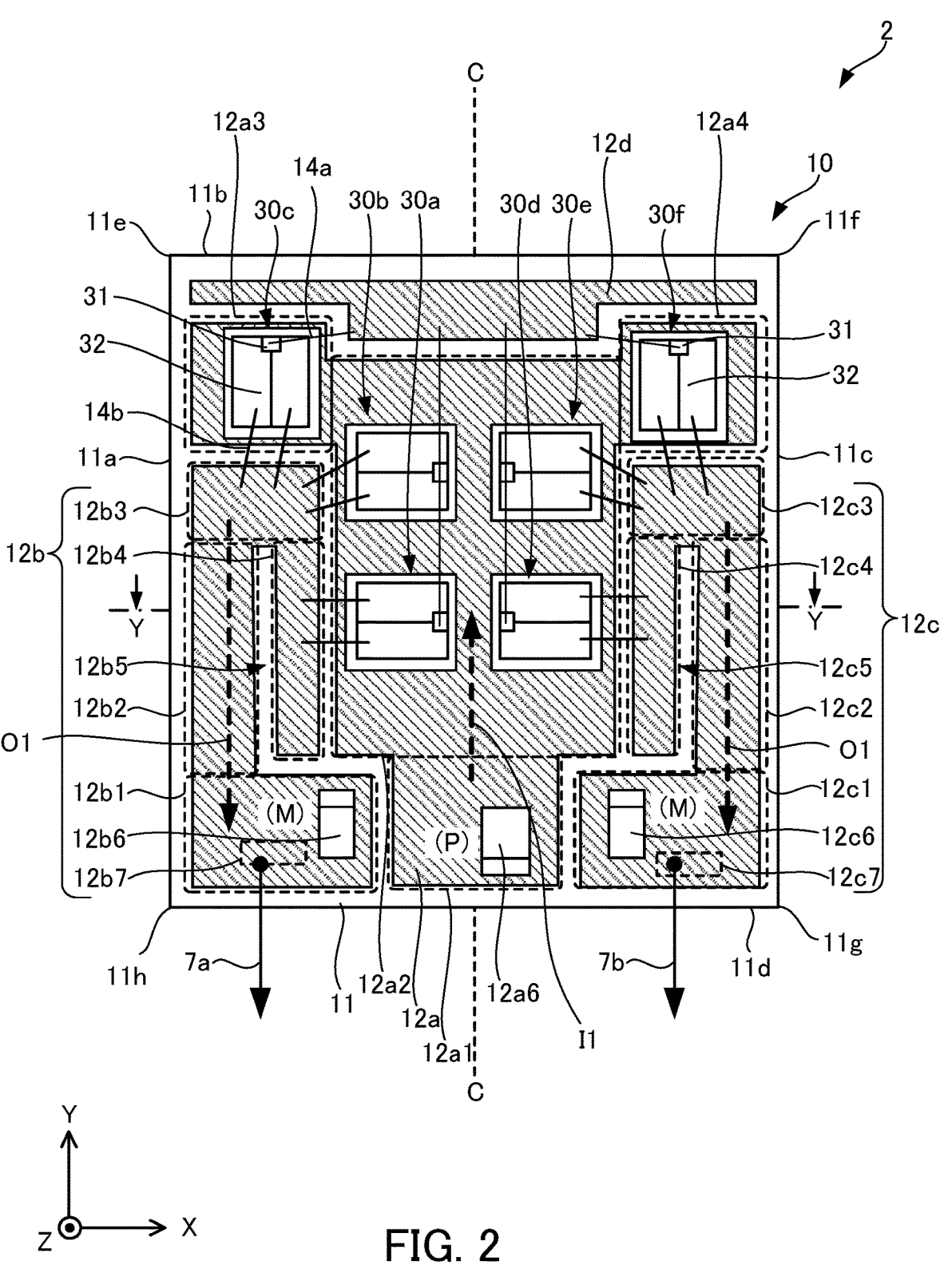
FIG. 2 is a plan view of a semiconductor unit (or "upper arm portion") included in the semiconductor device according to the present embodiment.

Next, the upper arm portion included in the semiconductor device 1 will be described with reference to FIGS. 2 and 3. FIG. 2 is a plan view of a semiconductor unit (or "upper arm portion") included in the semiconductor device according to the present embodiment. FIG. 3 is a cross-sectional view of a semiconductor unit (or "upper arm portion") included in the semiconductor device according to the present embodiment. Note that the semiconductor unit 2a that constructs the upper arm portion is given here as an example. The semiconductor unit 2b also has the same configuration. Also, the semiconductor units 2a and 2b are collectively referred to as the "semiconductor units 2". Note that the center line C in FIG. 2 is parallel to long sides 11a and 11c and passes through centers of short sides 11b and 11d.

The semiconductor unit 2 includes an insulated circuit board 10 and a plurality of semiconductor chips 30a to 30f. The insulated circuit board 10 includes an insulating board 11, a plurality of wiring boards 12a to 12d formed on the front surface of the insulating board 11, and a metal plate 13 formed on the rear surface of the insulating board 11. In plan view, the plurality of wiring boards 12a to 12d and the metal plate 13 have smaller external shapes than the external shape of the insulating board 11, and are formed inside the insulating board 11. Note that the shapes and number of the plurality of wiring boards 12a to 12d are mere examples.

The insulating board 11 is rectangular in shape in plan view. Corner portions of the insulating board 11 may be chamfered. As examples, the corner portions may be chamfered into a rounded or beveled shape. The insulating board 11 is surrounded on four sides by the long side 11a, the short side 11b, the long side 11c, and the short side 11d as external sides. The insulating board 11 includes a corner portion 11e formed of the long side 11a and the short side 11b, and a corner portion 11f formed of the short side 11b and the long side 11c. The insulating board 11 also includes a corner portion 11g formed of the long side 11c and the short side 11d, and a corner portion 11h formed of the short side 11d and the long side 11a.

The insulating board 11 is made of a ceramic with favorable thermal conductivity. As examples, the ceramic is made of a material whose main component is aluminum oxide, aluminum nitride, or silicon nitride. The thickness of the insulating board 11 is 0.2 mm or more and 2.0 mm or less.

The wiring boards 12a to 12d are constructed with a metal with superior electrical conductivity as a main component. Example metals include copper and copper alloy. The wiring boards 12a to 12d may be subjected to a plating process. Example plating materials include nickel, nickel-phosphorus alloy, nickel-boron alloy, silver, and silver alloy. Plating the wiring boards 12a to 12d improves corrosion resistance and bonding performance. The thickness of the wiring boards 12a to 12d is 0.1 mm or more and 1.0 mm or less, for example.

The wiring board 12a (or "first input wiring board") is substantially T-shaped in plan view. The wiring board 12a is formed substantially in the center of the front surface of the insulating board 11. This wiring board 12a includes an input part 12a1, a chip bonding part 12a2, and protruding parts 12a3 and 12a4.

The input part 12a1 (or "first input region") is rectangular in shape in plan view. The input part 12a1 is formed near the short side 11d of the insulating board 11 and at the center of the short side 11d. A terminal bonding region 12a6 is provided on the input part 12a1. An external connection terminal 8a (or "input terminal"), which is a P terminal, is bonded to the terminal bonding region 12a6.

The chip bonding part 12a2 (or "chip bonding region") is rectangular in shape in plan view. The chip bonding part 12a2 is integrally formed with the input part 12a1 and extends parallel to the long sides 11a and 11c toward the short side 11b. A gap is provided between a (+Y direction) end of the chip bonding part 12a2 and the short side 11b. The width (in the ±X direction) of the chip bonding part 12a2 is wider than the width in the same direction of the input part 12a1. Gaps are provided between the long sides 11a, 11c-side ends of the chip bonding part 12a2 and the long sides 11a, 11c.

In the chip bonding part 12a2, the semiconductor chips 30a and 30b are arranged in order along the long side 11a on the long side 11a side (that is, in a direction from the short side 11d toward the short side 11b). Likewise, in the chip bonding part 12a2, the semiconductor chips 30d and 30e are arranged in order along the long side 11c on the long side 11c side (that is, in a direction from the short side 11d toward the short side 11b). These semiconductor chips 30a, 30b, 30d, and 30e are arranged so that the control electrodes 31 face each other (and face the center line C).

The protruding parts 12a3 and 12a4 are rectangular in plan view. The protruding parts 12a3 and 12a4 extend from the long sides 11a and 11c ends of the chip bonding part 12a2 toward the long sides 11a and 11c on the +Y direction-side of the chip bonding part 12a2. The protruding parts 12a3 and 12a4 are formed integrally with the chip bonding part 12a2. Accordingly, the +Y-direction ends of the protruding parts 12a3 and 12a4 protrude further toward the short side 11b than the +Y-direction end of the chip bonding part 12a2. This means that a concave portion is formed in the chip bonding part 12a2 at the +Y direction end of the wiring board 12a. The semiconductor chips 30c and 30f are disposed on the protruding parts 12a3 and 12a4. In this configuration, the control electrodes 31 of the semiconductor chips 30c and 30f face the short side 11b.

Accordingly, the semiconductor chips 30a, 30b, and 30c are disposed on and along an L-shaped end portion on the long side 11a-side of the wiring board 12a. Likewise, the semiconductor chips 30d, 30e, and 30f are disposed on and along an L-shaped end on the long side 11c-side of the wiring board 12a. That is, the semiconductor chips 30a to 30c and 30d to 30f are connected in parallel to the wiring board 12a.

A wiring board 12b (or "first output wiring board") is provided on the long side 11a side of the wiring board 12a. That is, the wiring board 12b is provided in the gap between the long side 11a side-end of the wiring board 12a and the long side 11a. The wiring board 12b extends along the long side 11a of the front surface of the insulating board 11 from the short side 11d to the protruding part 12a3 of wiring board 12a on the long side 11a side. The wiring board 12b includes an output part 12b1 as a first output region, and a wiring part 12b2, a horizontal connecting part 12b3 and a vertical connecting part 12b4 as a first connection wiring region.

The output part 12b1 is rectangular in shape in plan view. The output part 12b1 is formed at the corner portion 11h of the insulating board 11. The output part 12b1 includes the terminal bonding region 12b6. The terminal bonding region 12b6 is positioned on the long side 11c side of the output part 12b1. An external connection terminal 8b (or "intermediate (output) terminal"), which is an M terminal, is bonded to the terminal bonding region 12b6. The output part 12b1 includes a first output region 12b7. The first output region 12b7 is positioned on the short side 11d-side of the output part 12b1.

The wiring part 12*b*2 is rectangular in shape in plan view, and is integrally formed with the output part 12*b*1. The wiring part 12*b*2 extends from the output part 12*b*1 toward the short side 11*b* along the long side 11*a* on the long side 11*a* side.

The horizontal connecting part 12*b*3 is rectangular in shape in plan view, and is integrally formed with the wiring part 12*b*2. The width in the ±X direction of the horizontal connecting part 12*b*3 is wider than the width in the same direction of the wiring part 12*b*2. This means that the horizontal connecting part 12*b*3 is connected to the wiring part 12*b*2 on the short side 11*d* side and extends from the long side 11*a* to the chip bonding part 12*a*2 of the wiring board 12*a*.

The vertical connecting part 12*b*4 is rectangular in shape in plan view, and is integrally formed with the horizontal connecting part 12*b*3. The width in the ±X direction of the vertical connecting part 12*b*4 is narrower than the width in the same direction of the horizontal connecting part 12*b*3. The vertical connecting part 12*b*4 extends from the horizontal connecting part 12*b*3 toward the short side 11*d* as far as the output part 12*b*1.

The wiring part 12*b*2, the horizontal connecting part 12*b*3, and the vertical connecting part 12*b*4 of the wiring board 12*b* form a U shape in plan view. The wiring board 12*b* also has a slit 12*b*5 (or "first slit") formed between the wiring part 12*b*2 and the vertical connecting part 12*b*4. The slit 12*b*5 is formed parallel to the long side 11*a* from the short side 11*d*-side end of the vertical connecting part 12*b*4 toward the horizontal connecting part 12*b*3.

The horizontal connecting part 12*b*3 and the vertical connecting part 12*b*4 of the wiring board 12*b* are respectively connected by main current wires 14*b* to the output electrodes 32 of the semiconductor chips 30*a* and 30*b*. The horizontal connecting part 12*b*3 of the wiring board 12*b* is connected by the main current wires 14*b* to the output electrodes 32 of the semiconductor chip 30*c*.

The wiring board 12*c* (or "first output wiring board") is the same as the wiring board 12*b*. That is, the wiring board 12*c* is provided on a long side 11*c*-side of the wiring board 12*a*. Alternatively, the wiring board 12*c* is provided in the gap between the long side 11*c* side-end of the wiring board 12*a* and the long side 11*c*. The wiring board 12*c* extends along the long side 11*c* of the front surface of insulating board 11 from the short side 11*d* to the protruding part 12*a*4 of wiring board 12*a* on the long side 11*c*. This wiring board 12*c* includes an output part 12*c*1 as a first output region, and a wiring part 12*c*2, a horizontal connecting part 12*c*3 and a vertical connecting part 12*c*4 as a first connection wiring region.

The output part 12*c*1 is rectangular in shape in plan view. The output part 12*c*1 is formed at the corner portion 11*g* of the insulating board 11. The output part 12*c*1 includes the terminal bonding region 12*c*6. The terminal bonding region 12*c*6 is positioned on the long side 11*a* side of the output part 12*c*1. An external connection terminal (or "intermediate terminal"), which is an M terminal, is bonded to the terminal bonding region 12*c*6. The output part 12*c*1 includes a first output region 12*c*7. The first output region 12*c*7 is positioned on the short side 11*d*-side of the output part 12*c*1.

The wiring part 12*c*2 is rectangular in shape in plan view, and is integrally formed with the output part 12*c*1. The wiring part 12*c*2 extends from the output part 12*c*1 toward the short side 11*b* along the long side 11*c* on the long side 11*c* side.

The horizontal connecting part 12*c*3 is rectangular in shape in plan view, and is integrally formed with the wiring part 12*c*2. The width in the ±X direction of the horizontal connecting part 12*c*3 is wider than the width in the same direction of the wiring part 12*c*2. This means that the horizontal connecting part 12*c*3 is connected to the wiring part 12*c*2 on the short side 11*d* side and extends from the long side 11*c* toward the chip bonding part 12*a*2 of the wiring board 12*a*.

The vertical connecting part 12*c*4 is rectangular in shape in plan view, and is integrally formed with the horizontal connecting part 12*c*3. The width in the ±X direction of the vertical connecting part 12*c*4 is narrower than the width in the same direction of the horizontal connecting part 12*c*3. The vertical connecting part 12*c*4 extends from the horizontal connecting part 12*c*3 toward the short side 11*d* as far as the output part 12*c*1.

The wiring part 12*c*2, the horizontal connecting part 12*c*3, and the vertical connecting part 12*c*4 of the wiring board 12*c* form a U shape in plan view. The wiring board 12*c* also has a slit 12*c*5 (or "first slit") formed between the wiring part 12*c*2 and the vertical connecting part 12*c*4. The slit 12*c*5 is formed parallel to the long side 11*a* from the short side 11*d*-side end of the vertical connecting part 12*c*4 toward the horizontal connecting part 12*c*3.

The horizontal connecting part 12*c*3 and the vertical connecting part 12*c*4 of the wiring board 12*c* are respectively connected by the main current wires 14*b* to the output electrodes 32 of the semiconductor chips 30*d* and 30*e*. The horizontal connecting part 12*c*3 of the wiring board 12*c* is connected by the main current wires 14*b* to the output electrodes 32 of the semiconductor chip 30*f*.

The wiring board 12*d* is formed to extend in parallel with the short side 11*b* from long side 11*a* to long side 11*c* near the short side 11*b* on the front surface of the insulating board 11. The wiring board 12*d* includes a central part that protrudes toward the short side 11*d*. This part enters a concave portion on the short side 11*b* side of the wiring board 12*a*.

The wiring board 12*d* is electrically connected to the control terminal 6*a* included in the housing 4. The wiring board 12*d* is connected by a control wire 14*a* to the control electrodes 31 of the semiconductor chips 30*a* and 30*b* that are laid out in a straight line. The wiring board 12*d* is also connected by a control wire 14*a* to the control electrodes 31 of the semiconductor chips 30*d* and 30*e* that are laid out in a straight line. The wiring board 12*d* is connected by the control wires 14*a* to the control electrodes 31 of the semiconductor chips 30*c* and 30*f*. A control signal inputted from the control terminal 6*a* is applied via the wiring board 12*d* and the control wires 14*a* to the control electrodes 31 of the semiconductor chips 30*a* to 30*f*.

On this insulated circuit board 10, when a current is inputted from the terminal bonding region 12*a*6, the current flows along a current direction I1 through the wiring board 12*a*. Currents outputted from the semiconductor chips 30*a*, 30*b*, and 30*c* flow along a current direction O1 through the wiring board 12*b*. Currents outputted from the semiconductor chips 30*d*, 30*e*, and 30*f* flow in the same way through wiring board 12*c*. Such current flows will be described in detail later.

The metal plate 13 is constructed of a metal with superior thermal conductivity as a main component. Example metals include aluminum, iron, silver, copper, or an alloy containing at least one of these metals. A plating treatment may be performed to improve corrosion resistance and bonding performance. Example plating materials in this case include nickel, nickel-phosphorus alloy, nickel-boron alloy, silver, and silver alloy.

As examples of the insulated circuit board with this configuration, a direct copper bonding (DCB) substrate or an active metal brazed (AMB) substrate may be used. The insulated circuit board 10 is bonded to the heat-dissipating base plate 15 via the bonding member 16. The insulated circuit board 10 may conduct heat generated by the semiconductor chips 30a to 30f via the wiring board 12a, the insulating board 11, and the metal plate 13 toward the heat-dissipating base plate 15.

The semiconductor chips 30a to 30f may include switching elements formed of power MOSFETs. Such semiconductor chips 30a to 30f are provided, on their front surfaces, with gate electrodes as control electrodes 31 and source electrodes as output electrodes 32, which are main electrodes. The control electrodes 31 are provided at the center of a side portion on the front surface, and the output electrode 32 is provided at a center portion on the front surface. The semiconductor chips 30a to 30f are also provided on their rear surfaces with drain electrodes as input electrodes 33, which are main electrodes. Such semiconductor chips 30a to 30f may be made of silicon carbide.

The semiconductor chips 30a to 30f may include reverse conducting (RC)-IGBT switching elements. An RC-IGBT is constructed with an IGBT and a free wheeling diode (FWD) in a single chip. The semiconductor chips 30a to 30f also have a gate electrode as a control electrode 31 and an emitter electrode as an output electrode 32, which is a main electrode, on the front surface, and a collector electrode as an input electrode 33, which is another main electrode, on the rear surface. Such semiconductor chips 30a to 30f may be made of silicon.

The semiconductor chips 30a to 30f are bonded to the wiring boards 12a and 12b by the bonding member 16. The bonding member 16 is sintered metal or solder. The main component of the sintered metal is porous metal, which has silver as a main component. The solder is made of lead-free solder containing a predetermined alloy as a main component. As examples, the predetermined alloy refers to alloy which is at least one of tin-silver alloy, tin-zinc alloy, and tin-antimony alloy. As examples, the solder may include additives. Example additives include copper, bismuth, indium, nickel, germanium, cobalt, and silicon. Also, the bonding member 16 may be sintered metal. The sintered metal is made of a metal containing silver as a main component.

The shape and layout of the wiring boards 12a to 12d of the insulated circuit board 10 included in the semiconductor unit 2 with the configuration described above are symmetrical with respect to the center line C depicted in FIG. 2. In addition, the semiconductor chips 30a to 30c and 30d to 30f disposed on the wiring board 12a are arranged so as to have line symmetry with respect to the center line C depicted in FIG. 2.

Figure 4:
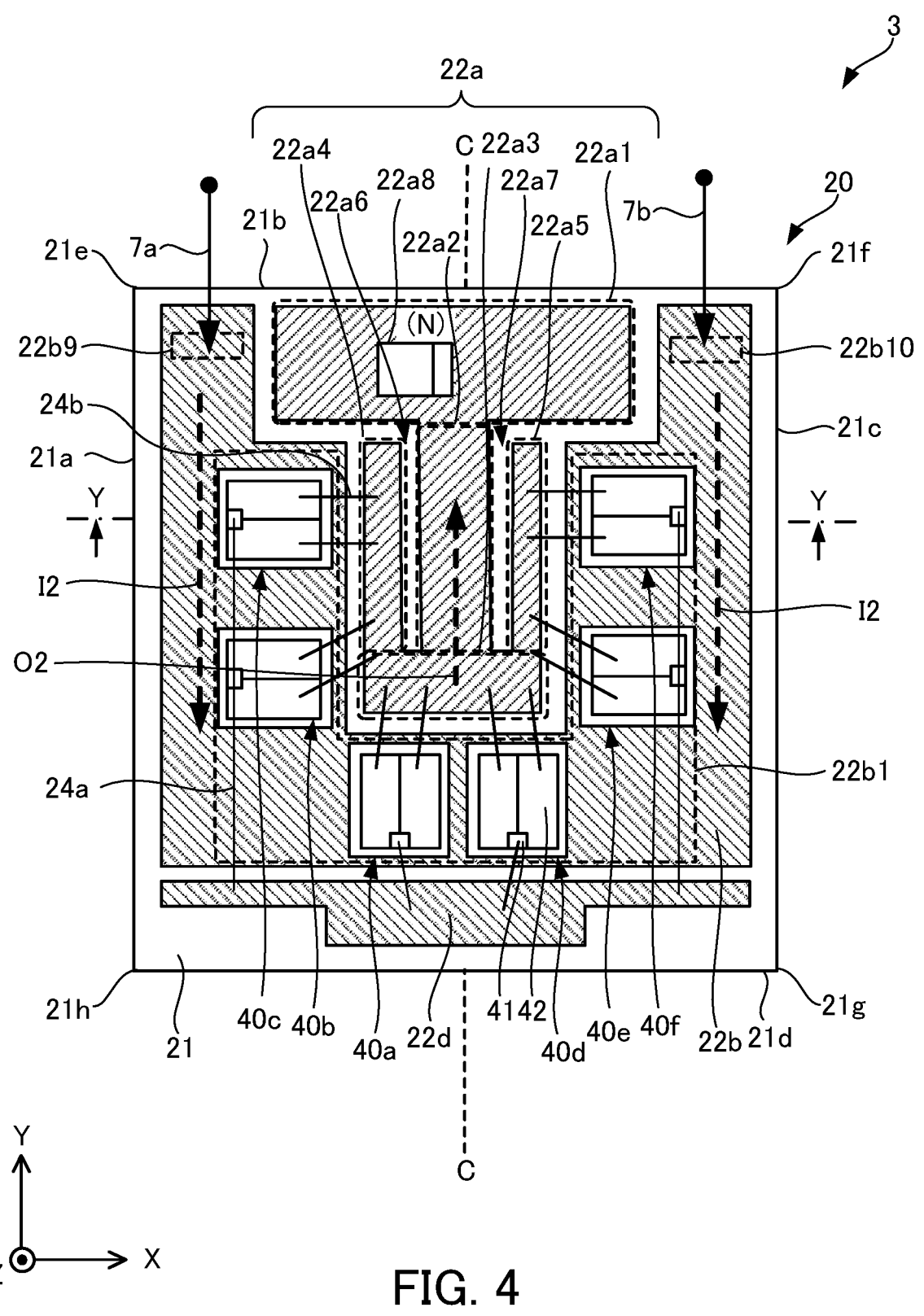
FIG. 4 is a plan view of a semiconductor unit (or "lower arm portion") included in the semiconductor device according to the present embodiment.

Next, the lower arm portion included in the semiconductor device 1 will be described with reference to FIGS. 4 and 5. FIG. 4 is a plan view of a semiconductor unit (or "lower arm portion") included in the semiconductor device according to the present embodiment. FIG. 5 is a cross-sectional view of a semiconductor unit (or "lower arm portion") included in the semiconductor device according to the present embodiment. Note that the semiconductor unit 3a that constructs the lower arm portion is given here as an example. The semiconductor unit 3b also has the same configuration. Also, the semiconductor units 3a and 3b are collectively referred to as the "semiconductor units 3". Note that the center line C in FIG. 4 is parallel to long sides 21a and 21c and passes through the centers of short sides 21b and 21d.

The semiconductor unit 3 includes an insulated circuit board 20 and a plurality of semiconductor chips 40a to 40f. The insulated circuit board 20 includes an insulating board 21, a plurality of wiring boards 22a, 22b, and 22d formed on the front surface of the insulating board 21, and a metal plate 23 formed on the rear surface of the insulating board 21. In plan view, the plurality of wiring boards 22a, 22b, and 22d and the metal plate 23 have smaller external shapes than the external shape of the insulating board 21, and are formed inside the insulating board 21. Note that the shapes and number of the plurality of wiring boards 22a, 22b, and 22d are mere examples.

The insulating board 21 is constructed in the same way as the insulating board 11. That is, the insulating board 21 is rectangular in shape in plan view. Corner portions of the insulating board 21 may be chamfered. As examples, the corner portions may be chamfered into a rounded or beveled shape. The insulating board 21 is surrounded on four sides by a long side 21a, a short side 21b, a long side 21c, and a short side 21d. The insulating board 21 includes the corner portion 21e formed of the long side 1a and the short side 21b, and the corner portion 21f formed of the short side 21b and the long side 21c. The insulating board 21 also includes the corner portion 21g formed of the long side 21c and the short side 21d, and the corner portion 21h formed of the short side 21d and the long side 21a.

The insulating board 21 is made of a ceramic with favorable thermal conductivity. As examples, the ceramic is made of a material whose main component is aluminum oxide, aluminum nitride, or silicon nitride. The thickness of the insulating board 21 is 0.2 mm or more and 2.0 mm or less.

The wiring boards 22a, 22b, and 22d are constructed of a metal with superior electrical conductivity. Example metals include copper and copper alloy. The wiring boards 12a to 12d may be subjected to a plating process. Example plating materials include nickel, nickel-phosphorus alloy, nickel-boron alloy, silver, and silver alloy. Plating the wiring boards 22a, 22b, and 22d improves corrosion resistance and bonding performance. The thickness of the wiring boards 22a, 22b, and 22d is 0.1 mm or more and 1.0 mm or less, for example.

The wiring board 22a (or "second output wiring board") is substantially T-shaped in plan view. The wiring board 22a is formed on the short side 21b-side of the front surface of the insulating board 21. This wiring board 22a includes an output part 22a1 as a second output region, and a wiring part 22a2, a horizontal connecting part 22a3 and vertical connecting parts 22a4 and 22a5 as a second connection wiring region.

The output part 22a1 (or "second output region") is rectangular in shape in plan view. The output part 22a1 is formed in the center of the insulating board 21 near the short side 21b side and extends toward the long sides 21a and 21c. A terminal bonding region 22a8 is provided on the output part 22a1. An external connection terminal 8c (or "output terminal"), which is an N terminal, is bonded to the terminal bonding region 22a8.

The wiring part 22a2 is rectangular in shape in plan view. The wiring part 22a2 is integrally formed with the output part 22a1, is parallel with the long sides 21a and 21c, and extends toward the short side 21d. The width (in the ±X direction) of the wiring part 22a2 is narrower than the width in the same direction of the output part 22a1.

The horizontal connecting part 22a3 is rectangular in shape in plan view, and is integrally formed with the wiring part 22a2. The width in the ±X direction of the horizontal connecting part 22a3 is wider than the width in the same direction of the wiring part 22a2. This means that the horizontal connecting part 22a3 extends from the wiring part 22a2 toward the long sides 21a and 21c.

The vertical connecting parts 22a4 and 22a5 are rectangular in shape in plan view, and are integrally formed with the horizontal connecting part 22a3. The widths in the ±X direction of the vertical connecting parts 22a4 and 22a5 (the widths of the second vertical connection wiring parts) are narrower than the width in the same direction of the wiring part 22a2 (the width of the second wiring part). The vertical connecting parts 22a4 and 22a5 extend from the horizontal connecting part 22a3 toward the short side 21b as far as the output part 22a1.

The wiring part 22a2, the horizontal connecting part 22a3, and the vertical connecting parts 22a4 and 22a5 of the wiring board 22a form a U shape in plan view. The wiring board 22a also has slits 22a6 and 22a7 (or "second slits") formed between the wiring part 22a2 and the vertical connecting parts 22a4 and 22a5. The slits 22a6 and 22a7 are formed parallel to the long side 21a from the short side 21b-side ends of the vertical connecting parts 22a4 and 22a5 toward the horizontal connecting part 22a3.

The vertical connecting parts 22a4 and 22a5 of the wiring board 22a are respectively connected via main current wires 24b to output electrodes 42 of semiconductor chips 40b, 40c, 40e, and 40f, described later. The horizontal connecting part 22a3 of the wiring board 22a is connected via main current wires 14b to the output electrodes 42 of the semiconductor chips 40a and 40d, described later.

The wiring board 22b is U shaped in plan view. The wiring board 22b is formed on the insulating board 21 to surround the wiring board 22a between the respective ends of the wiring board 22a and the long side 21a, the short side 21d, and the long side 21c.

The semiconductor chips 40a to 40c and 40d to 40f are bonded to the chip bonding region 22b1 of the wiring board 22b. In more detail, the semiconductor chips 40c and 40b and semiconductor chips 40f and 40e are respectively disposed in parts of the wiring board 22b that face the vertical connecting parts 22a4 and 22a5 of the wiring board 22a. The control electrodes 41 of the semiconductor chips 40c and 40b and the semiconductor chips 40f and 40e respectively face the long sides 21a and 21c. These control electrodes 41 are aligned in a straight line in the ±Y direction. The semiconductor chips 40a and 40d are respectively disposed at a part of the wiring board 22b that faces the horizontal connecting part 22a3 of the wiring board 22a. The control electrodes 41 of the semiconductor chips 40a and 40d face the short side 21d. These control electrodes 41 are also aligned in a straight line in the ±X direction.

The wiring board 22b includes second input regions 22b9 and 22b10 on the short side 21b side. The second input regions 22b9 and 22b10 are electrically connected by connecting wires 7a and 7b to the first output regions 12b7 and 12c7 of the wiring boards 12b and 12c of the semiconductor unit 2.

The wiring board 22d is formed on the short side 21d side of the front surface of the insulating board 21 so as to extend from the long side 21a to the long side 21c in parallel with the short side 21d. The wiring board 22d includes a central portion that protrudes toward the short side 21d.

The wiring board 22d is electrically connected to the control terminal 6b included in the housing 4. The wiring board 22d is connected by the control wires 14a to the control electrodes 41 of the semiconductor chips 40a and 40d. The wiring board 22d is also connected by the control wires 14a to the control electrodes 41 of the semiconductor chips 40c and 40b. The wiring board 22d is also connected by the control wires 14a to the control electrodes 41 of the semiconductor chips 40c and 40f. A control signal inputted from the control terminal 6b is applied via the wiring board 22d and the control wires 14a to the control electrodes 41 of the semiconductor chips 40a to 40f.

On this insulated circuit board 20, when a current is inputted from the semiconductor unit 2, the current flows along a current direction 12 through the wiring board 22b. Currents outputted from the semiconductor chips 40a, 40b, and 40c and the semiconductor chips 40d, 40e, and 40f flow along a current direction O2 through the wiring board 22a. Such current flows will be described in detail later.

The metal plate 23 is the same as the metal plate 13. That is, the metal plate 23 is constructed of a metal with superior thermal conductivity as a main component. Example metals include aluminum, iron, silver, copper, or alloy containing at least one of these metals. A plating process may be performed to improve corrosion resistance and improve bonding performance. Example plating materials include nickel, nickel-phosphorus alloy, nickel-boron alloy, silver, and silver alloy.

As examples of the insulated circuit board with this configuration, a DCB substrate or an AMB substrate may be used. The insulated circuit board 20 is bonded to the heat-dissipating base plate 15 via the bonding member 26. The insulated circuit board 20 may conduct heat generated by the semiconductor chips 40a to 40f via the wiring board 22a, the insulating board 21, and the metal plate 23 toward the heat-dissipating base plate 15.

The semiconductor chips 40a to 40f are the same as the semiconductor chips 30a to 30f. That is, the semiconductor chips 40a to 40f each have a control electrode 41 and an output electrode 42, which is a main electrode, on the front surface, and an input electrode 43 on the rear surface. The control electrode 41 is provided in the center of a side portion on the front surface and the output electrode 42 is provided at a center portion on the front surface. The semiconductor chips 40a to 40f are bonded to the wiring board 22b by the bonding member 26.

The shapes and layout of the wiring boards 22a, 22b, and 22d of the insulated circuit board 20 included in the semiconductor unit 3 with the configuration described above have line symmetry with respect to the center line C depicted in FIG. 4. In addition, the semiconductor chips 40a to 40c and 40d to 40f disposed on the wiring board 22b are disposed so as to have line symmetry with respect to the center line C depicted in FIG. 4.

The semiconductor device 1 is obtained by disposing the semiconductor units 3a and 3b in the −Y direction relative to the semiconductor units 2a and 2b described above and electrically connecting the semiconductor units with the connecting wires 7a and 7b. That is, the semiconductor units 3a and 3b are disposed so that the short sides 21b of the semiconductor units 3a and 3b face the short sides 11d of the semiconductor units 2a and 2b, respectively.

Figure 6:
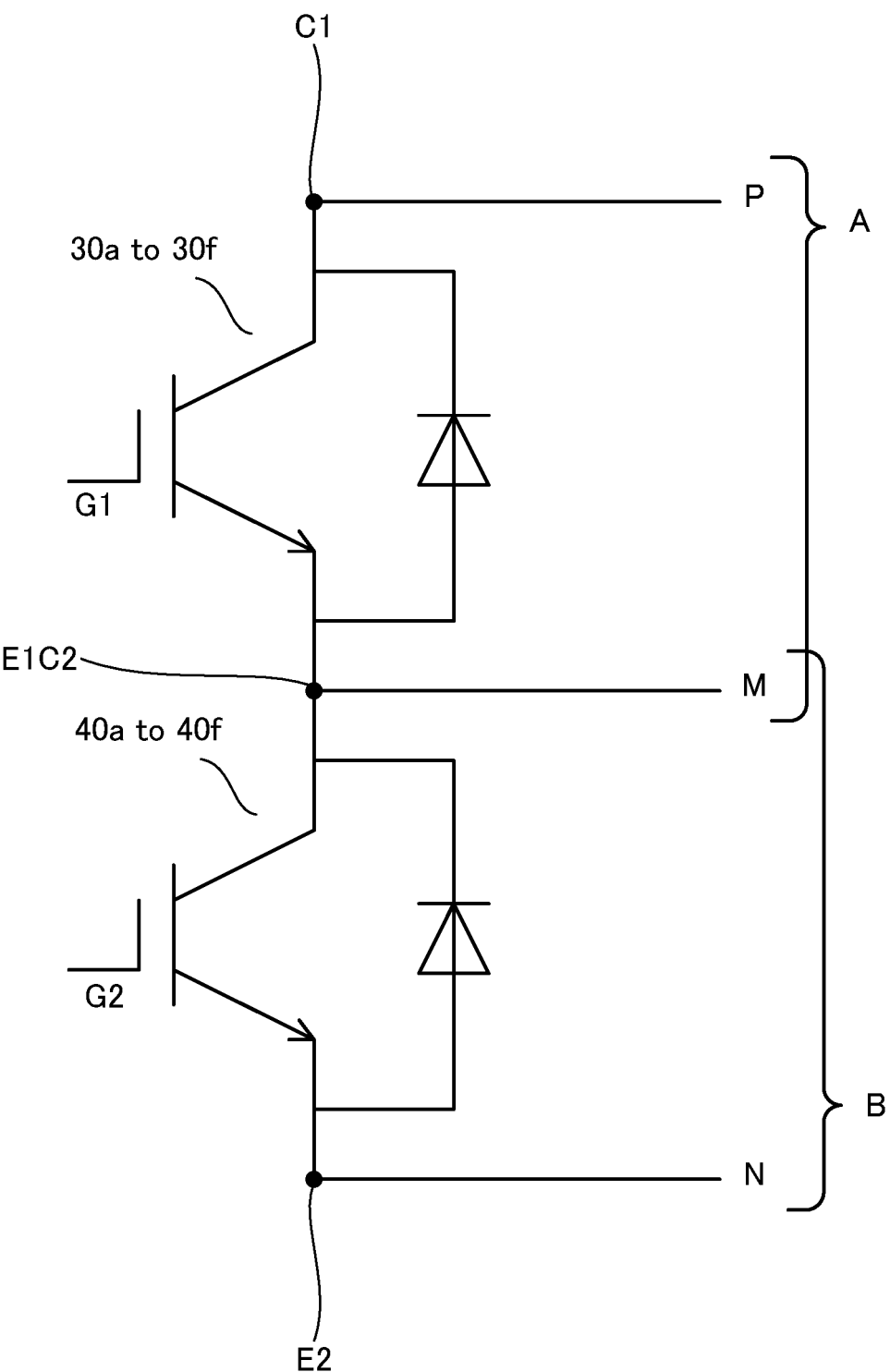
FIG. 6 is a circuit configuration diagram of a semiconductor unit included in the semiconductor device according to the present embodiment.

Next, a half bridge circuit including the upper arm portion and the lower arm portion included in the semiconductor device 1 will be described with reference to FIG. 6. FIG. 6 is a circuit configuration diagram of a semiconductor unit included in the semiconductor device according to the present embodiment.

A connection node P is connected to the positive terminal of an external power source (not illustrated). The connection node P and a connection node C1 of the input electrodes 33 (collector electrodes) of the semiconductor chips 30a to 30f are connected by the wiring board 12a.

A connection node M is connected to a load (not illustrated). The connection node M and a connection node E1C2 of the output electrodes 32 (emitter electrodes) of the semiconductor chips 30a to 30f are connected by the main current wires 14b and the wiring boards 12b and 12c. The connection node M and the connection node E1C2 of the input electrodes 43 (collector electrodes) of the semiconductor chips 40a to 40f are connected by the wiring board 22b and the connecting wires 7a and 7b.

A connection node N is connected to a negative terminal of the external power source (not illustrated). The connection node N and a connection node E2 of the output electrodes 42 (emitter electrodes) of the semiconductor chips 40a to 40f are connected by the main current wires 24b and the wiring board 22a.

The connection nodes G1 and G2 are connected to a control power source (not illustrated). The connection node G1 is connected to the control electrodes 31 of the semiconductor chips 30a to 30f via the wiring board 12d and the control wires 14a. The connection node G2 is connected to the control electrodes 41 of the semiconductor chips 40a to 40f via the wiring board 22d and the control wires 24a.

The upper arm portion A of the semiconductor device 1 includes the semiconductor unit 2. The lower arm portion B of the semiconductor device 1 includes the semiconductor unit 3. By electrically connecting the wiring boards 12b and 12c of the semiconductor unit 2 and the wiring board 22b of the semiconductor unit 3 with the connecting wires 7a and 7b, the upper arm portion A and the lower arm portion B are connected. By doing so, the semiconductor device 1 is able to function as a half bridge circuit including the upper arm portion A and the lower arm portion B.

Figure 7:
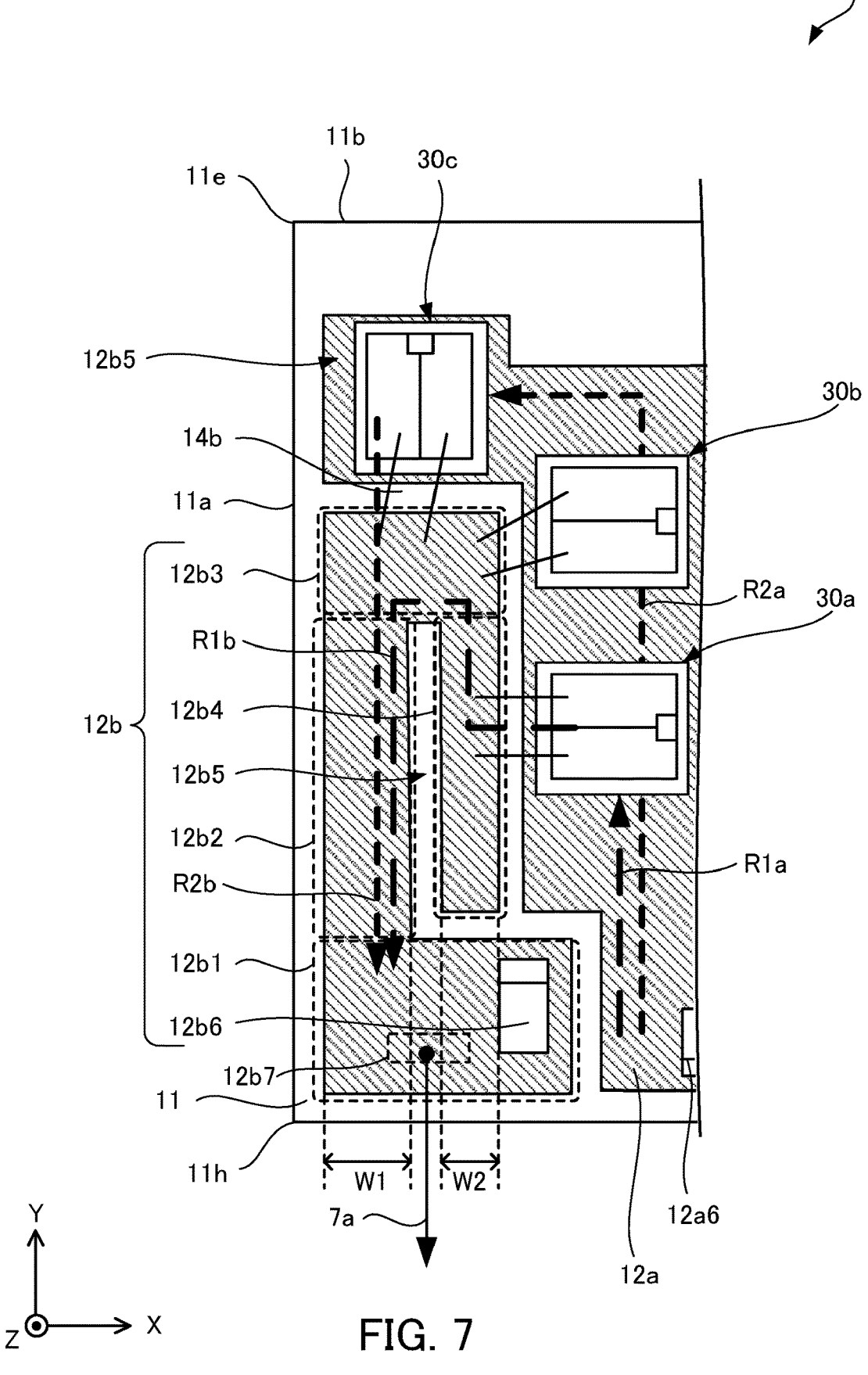
FIG. 7 is a plan view useful in explaining current flows in a semiconductor unit (the upper arm portion) included in the semiconductor device according to the present embodiment.

Next, the current paths in the semiconductor unit 2 will be described with reference to FIG. 7. FIG. 7 is a plan view useful in explaining current flows in a semiconductor unit (the upper arm portion) included in the semiconductor device according to the present embodiment. Note that FIG. 7 is an enlarged view of the wiring board 12b of the semiconductor unit 2. Although the wiring board 12b is described here, the wiring board 12c is also the same as the wiring board 12b.

An external positive electrode is connected to the terminal bonding region 12a6 of the wiring board 12a of the semiconductor unit 2, and an external negative electrode is connected to the terminal bonding region 22a8 of the wiring board 22a of the semiconductor unit 3. A control signal is applied to the control electrodes 31 of the semiconductor chips 30a to 30f. After this, as depicted in FIG. 7, current flows through the wiring board 12a in parallel to the long side 11a (in the +Y direction) from the terminal bonding region 12a6.

The current passing through the semiconductor chip 30a disposed at a position closest to the terminal bonding region 12a6 will now be described. The current (current path R1a) flowing through the wiring board 12a in the +Y direction from the terminal bonding region 12a6 is inputted into the input electrode 33 on the rear surface of the semiconductor chip 30a. When a current is inputted into the input electrode 33 on the rear surface of the semiconductor chip 30a, the current is outputted from the output electrode 32 on the front surface of the semiconductor chip 30a. A current (current path Rib) outputted from the output electrode 32 of the semiconductor chip 30a flows via the main current wire 14b into the vertical connecting part 12b4 of the wiring board 12b and flows in the +Y direction. The current that has flowed through the vertical connecting part 12b4 flows through the horizontal connecting part 12b3 toward the long side 11a (that is, in the −X direction) and flows through the wiring part 12b2 toward the short side 11d (−Y direction) side. The current is then outputted from the terminal bonding region 12b6 of the output part 12b1 or from a connecting wire 7a connected to the first output region 12b7. That is, the current passing through the semiconductor chip 30a flows through the current path (R1a+R1b).

Next, the current passing through the semiconductor chip 30c disposed at a position farthest from the terminal bonding region 12a6 will now be described. The current (current path R2a) flowing through the wiring board 12a in the +Y direction from the terminal bonding region 12a6 is inputted into the input electrode 33 on the rear surface of the semiconductor chip 30c. When a current is inputted into the input electrode 33 on the rear surface of the semiconductor chip 30c, the current is outputted from the output electrode 32 on the front surface of the semiconductor chip 30c. A current (current path R2b) outputted from the output electrode 32 of the semiconductor chip 30c flows via the main current wire 14b into the horizontal connecting part 12b3 of the wiring board 12b and flows in the −Y direction. The current that has flowed through the horizontal connecting part 12b3 flows through the wiring part 12b2 toward the short side 11d (that is, in the −Y direction). The current is then outputted from the terminal bonding region 12b6 of the output part 12b1 or from a connecting wire 7a connected to the first output region 12b7. That is, the current passing through the semiconductor chip 30c flows through the current path (R2a+R2b).

Note that the width W1 of the wiring part 12b2 (the width of the first wiring part) is wider than the width W2 of the vertical connecting part 12b4 (the width of the first vertical connecting part). This means that even when currents outputted from the semiconductor chips 30a, 30b, and 30c merge at the wiring part 12b2, it is possible for a sufficient current to flow.

Figure 8:
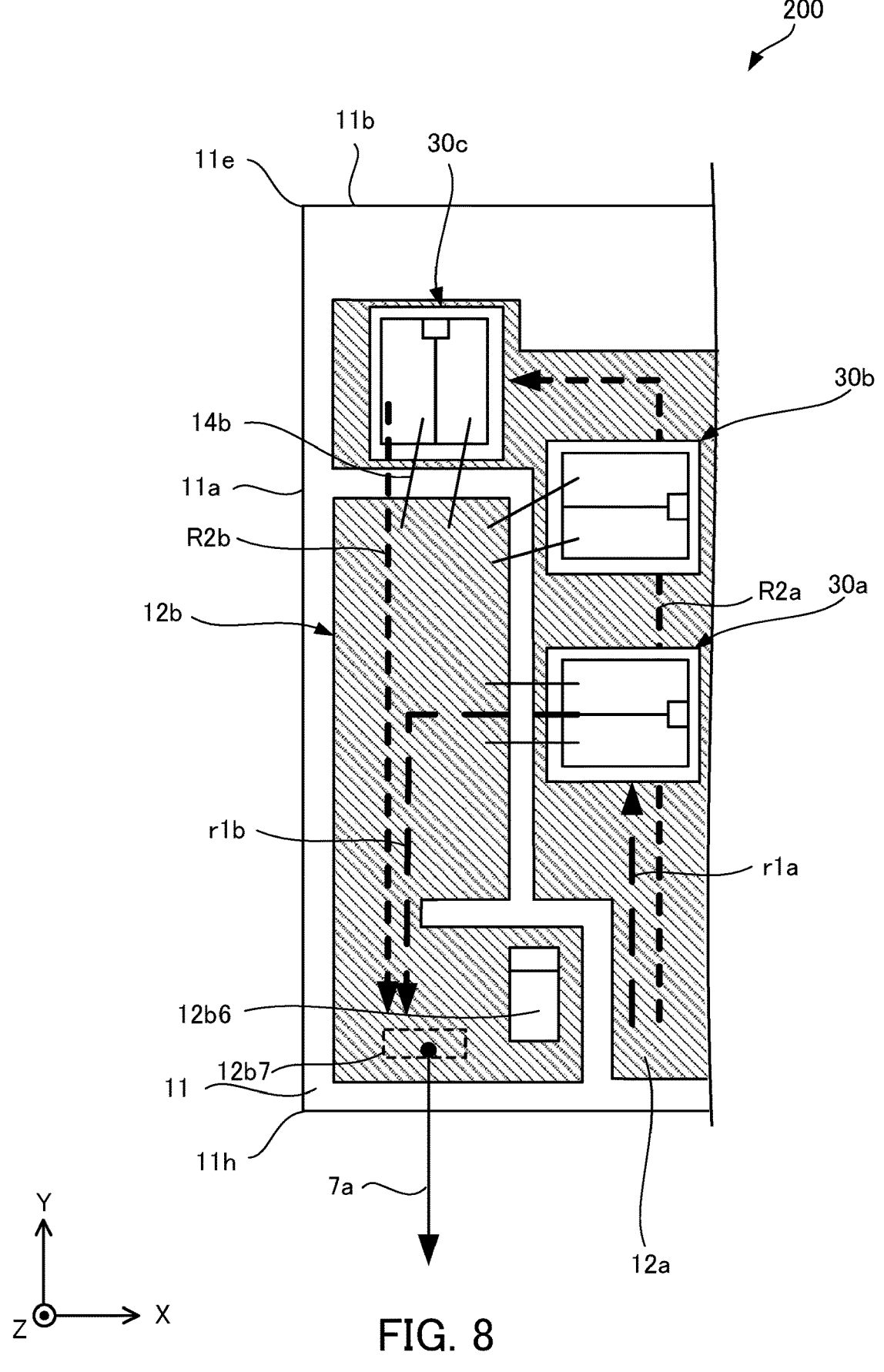
FIG. 8 is a plan view useful in explaining current flows in a semiconductor unit (an upper arm portion) included in a semiconductor device that is a comparative example.

Current paths in a semiconductor unit that is a comparative example will now be described with reference to FIG. 8. FIG. 8 is a plan view useful in explaining current flows in a semiconductor unit (an upper arm portion) included in a semiconductor device that is a comparative example. The semiconductor unit 200 in FIG. 8 is a configuration where the slit 12b5 is not formed in the semiconductor unit 2 in FIG. 7. That is, in the semiconductor unit 200 in FIG. 8, the vertical connecting part 12b4 and the wiring part 12b2 of the semiconductor unit 2 in FIG. 7 are integrally connected.

Here also, in the same way as in FIG. 7, the currents passing through the semiconductor chips 30a and 30c will be described. First, a current passing through the semiconductor chip 30a will be described. The current (current path r1a) flowing in the +Y direction through the wiring board 12a from the terminal bonding region 12a6 is inputted into the input electrode 33 on the rear surface of the semiconductor chip 30a. When a current is inputted into the input electrode 33 on the rear surface of the semiconductor chip 30a, a current is outputted from the output electrode 32 on the front surface of the semiconductor chip 30a. The current (current path rib) outputted from the output electrode 32 of the semiconductor chip 30a flows via the main current wire 14b into the wiring board 12b. The current flows through the wiring board 12b (the wiring part 12b2) toward the short side 11d (that is, in the −Y direction). The current is then outputted from the terminal bonding region 12*b*6 of the output part 12*b*1 or from a connecting wire 7*a* connected to the first output region 12*b*7. That is, the current passes through the semiconductor chip 30*a* on the current path (r1*a*+r1*b*). Note that the current passing through the semiconductor chip 30*c* in this case flows through the current path (R2*a*+R2*b*) in the same way as the configuration in FIG. 7.

In FIG. 8, the current path (R2*a*+R2*b*) is longer than the current path (r1*a*+r1*b*). When the lengths of current paths differ in this way, a difference in impedance will occur in keeping with the lengths. As a result, a current imbalance will occur between the semiconductor chips 30*a* and 30*c*. When a current imbalance occurs, the loss on each current path will be uneven, which makes it difficult to extend the life of the semiconductor device 1.

For this reason, in the semiconductor unit 2, the wiring boards 12*b* and 12*c* include the output parts 12*b*1 and 12*c*1 on their respective short side 11*d* sides and also include the horizontal connecting parts 12*b*3 and 12*c*3 and the vertical connecting parts 12*b*4 and 12*c*4, which are electrically connected to the output electrodes 32 of the semiconductor chips 30*a* to 30*c* and 30*d* to 30*f* on the short side 11*b* sides of the output parts 12*b*1 and 12*c*1. The slits 12*b*5 and 12*c*5 are formed in the vertical connecting parts 12*b*4 and 12*c*4 along the long sides 11*a* and 11*c* from the output part 12*b*1 and 12*c*1-side ends. As a result, the current outputted from the semiconductor chip 30*a* disposed at a position closest to the terminal bonding region 12*a*6 passes via the vertical connecting parts 12*b*4 and 12*c*4 and the horizontal connecting parts 12*b*3 and 12*c*3 before reaching the output parts 12*b*1 and 12*c*1 of the wiring boards 12*b* and 12*c*. That is, the current path (R1*a*+R1*b*) taken by the current outputted from the semiconductor chip 30*a* to reach the output parts 12*b*1 and 12*c*1 of the wiring boards 12*b* and 12*c* is made longer. This means that the difference between the current path (R1*a*+R1*b*) and the current path (R2*a*+R2*b*) of the current outputted from the semiconductor chip 30*c* disposed at the position farthest from the terminal bonding region 12*a*6 that reaches the output parts 12*b*1 and 12*c*1 of the wiring boards 12*b* and 12*c* becomes smaller. Accordingly, it is possible to suppress current imbalances between the semiconductor chips 30*a* to 30*c* and 30*d* to 30*f*, which are connected in parallel, due to the distances at which the chips are disposed from the terminal bonding region 12*a*6. As a result, non-uniformity in the loss on each current path is suppressed, the life of the semiconductor device 1 is extended, and the reliability of the semiconductor device 1 is improved.

Figure 9:
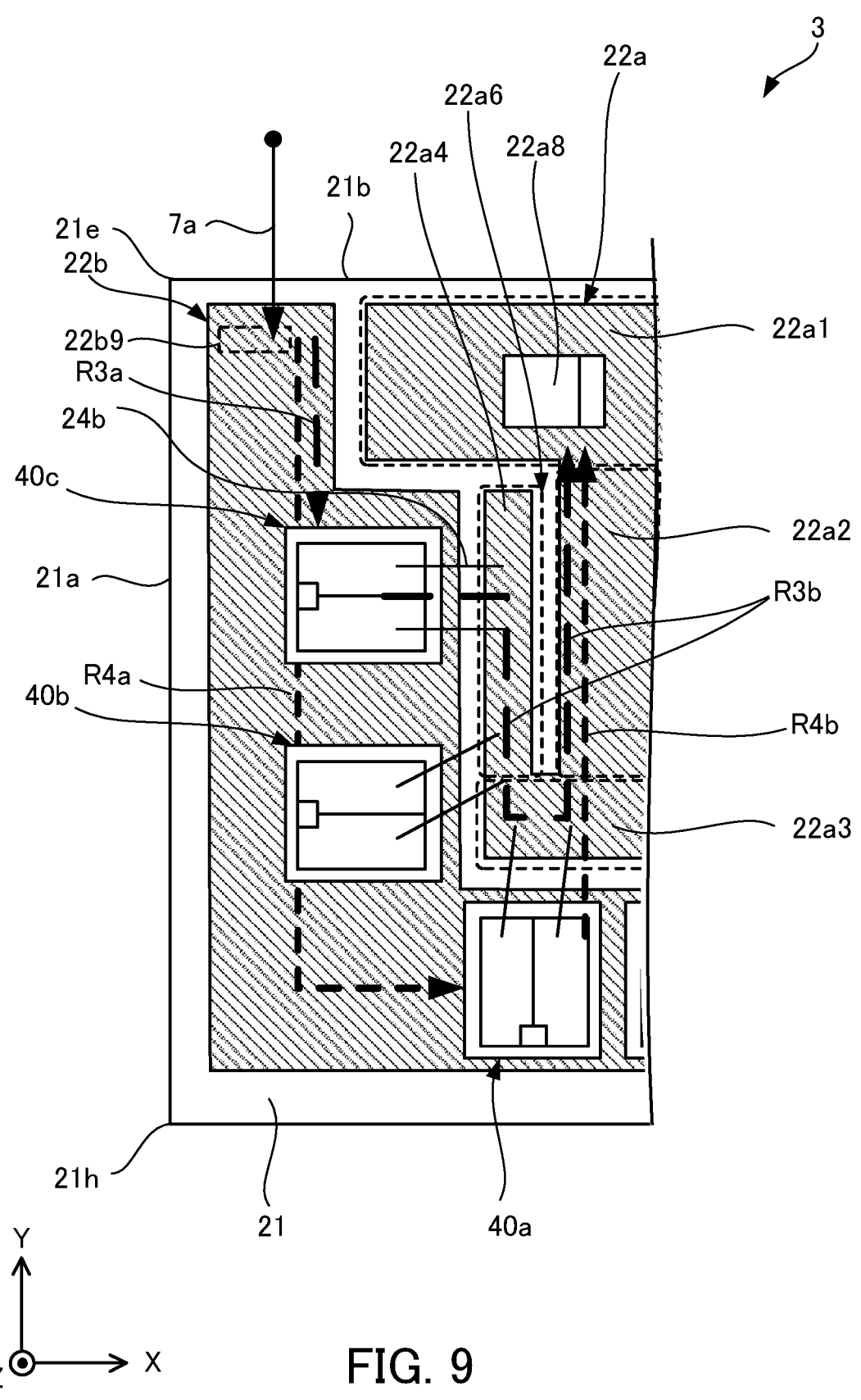
FIG. 9 is a plan view useful in explaining current flows in a semiconductor unit (the lower arm portion) included in the semiconductor device according to the present embodiment.

Next, the current paths in the semiconductor unit 3 will be described with reference to FIG. 9. FIG. 9 is a plan view useful in explaining current flows in a semiconductor unit (the lower arm portion) included in the semiconductor device according to the present embodiment. Note that FIG. 9 is an enlarged view of a long side 21*a*-side part of the wiring board 22*b* of the semiconductor unit 3. Although the long side 21*a*-side part of the wiring board 22*b* is described here, the same applies to the long side 21*c*-side part of the wiring board 22*b*.

The current that passes through the semiconductor unit 2 via the semiconductor chip 40*c* disposed at a position closest to the second input region 22*b*9 to which the connecting wire 7*a* is connected will be described. A current (current path R3*a*) flowing through the wiring board 22*b* in the −Y direction from the second input region 22*b*9 is inputted into the input electrode 43 on the rear surface of the semiconductor chip 40*c*. When a current is inputted into the input electrode 43 on the rear surface of the semiconductor chip 40*c*, a current is outputted from the output electrode 42 on the front surface of the semiconductor chip 40*c*. The current (current path R3*b*) outputted from the output electrode 42 of the semiconductor chip 40*c* flows via the main current wire 24*b* into the vertical connecting part 22*a*4 of the wiring board 22*a* and flows in the −Y direction. The current that has flowed through the vertical connecting part 22*a*4 passes through the horizontal connecting part 22*a*3 toward the long side 21*c* (that is, in the +X direction) and flows through the wiring part 22*a*2 toward the short side 21*b* (that is, in the +Y direction). The current is then outputted from the terminal bonding region 22*a*8 of the output part 22*a*1. That is, the current passing through the semiconductor chip 40*c* flows on the current path (R3*a*+R3*b*).

Next, the current that passes through the semiconductor chip 40*a* disposed at a position farthest from the second input region 22*b*9 will be described. The current (current path R4*a*) flowing through the wiring board 22*b* in the −Y direction from the second input region 22*b*9 is inputted into the input electrode 43 on the rear surface of the semiconductor chip 40*a*. When a current is inputted into the input electrode 43 on the rear surface of the semiconductor chip 40*a*, the current is outputted from the output electrode 42 on the front surface of the semiconductor chip 40*a*. The current (current path R4*b*) outputted from the output electrode 42 of the semiconductor chip 40*a* flows via the main current wire 24*b* into the horizontal connecting part 22*a*3 of the wiring board 22*a*, and flows in the +X direction. The current that has flowed through the horizontal connecting part 22*a*3 flows through the wiring part 22*a*2 toward the short side 21*b* (in the +Y direction). The current is then outputted from the terminal bonding region 22*a*8 of the output part 22*a*1. That is, the current passing through the semiconductor chip 40*a* flows on the current path (R4*a*+R4*b*).

In the semiconductor unit 3, the wiring board 22*a* is provided with the output part 22*a*1 on the short side 21*b* side, and also includes the horizontal connecting part 22*a*3 and the vertical connecting parts 22*a*4 and 22*a*5, which are electrically connected to the output electrodes 42 of the semiconductor chips 40*a* to 40*c* and 40*d* to 40*f*, on the short side 21*d* side of the output part 22*a*1. The slits 22*a*6 and 22*b*7 are formed in the vertical connecting parts 22*a*4 and 22*a*5 along the long side 21*a* from the output part 22*a*1-side ends. As a result, the current outputted from the semiconductor chips 40*c* and 40*f* disposed at positions closest to the second input regions 22*b*9 and 22*b*10 pass via the vertical connecting parts 22*a*4 and 22*a*5 and the horizontal connecting part 22*a*3 before reaching the output part 22*a*1 of the wiring board 22*a*. That is, the current path (R3*a*+R3*b*) for the currents outputted from the semiconductor chips 40*c* and 40*f* to reach the output part 22*a*1 of the wiring board 22*a* is made longer. This means that the difference between a current path (R3*a*+R3*b*) and a current path (R4*a*+R4*b*) for the current outputted from the semiconductor chips 40*a* and 40*d* disposed at positions farthest from the second input regions 22*b*9 and 22*b*10 to reach the output part 22*a*1 of the wiring board 22*a* becomes smaller. Accordingly, it is possible to suppress current imbalances between the semiconductor chips 40*a* to 40*c* and 40*d* to 40*f*, which are connected in parallel, due to the distances at which the chips are disposed from the second input regions 22*b*9 and 22*b*10. As a result, non-uniformity in the loss on each current path is suppressed, the life of the semiconductor device 1 is extended, and the reliability of the semiconductor device 1 is improved.

The semiconductor device 1 described above includes the semiconductor chips 30*a* to 30*c* and 30*d* to 30*f*, which include the input electrodes 33 on their rear surfaces and the output electrodes 32 on their front surfaces, and the insulated circuit board 10. The insulated circuit board 10 is rectangular in shape, has the long side 11a, the short side 11b, the long side 11c and the short side 11d in that order, and includes the wiring board 12a that extends parallel to the long side 11a and the wiring boards 12b and 12c that are disposed on the long sides 11a and 11c of the wiring board 12a and extend parallel to the long side 11a. The wiring board 12a is provided with the terminal bonding region 12a6, which is disposed on the short side 11d side, and the chip bonding part 12a2 and the protruding parts 12a3 and 12a4, to which a plurality of semiconductor chips 30a to 30c and 30e to 30f are bonded and which are disposed on the short side 11b side. The wiring boards 12b and 12c are provided with the output parts 12b1 and 12c1 on their short side 11d-sides, and the vertical connecting parts 12b4 and 12c4 and the horizontal connecting parts 12b3 and 12c3, which are electrically connected to the output electrodes 32 of the plurality of semiconductor chips 30a to 30c and 30e to 30f, on their respective short side 11b-sides. Here, the vertical connecting parts 12b4 and 12c4 have the slits 12b5 and 12c5 formed along the long sides 11a and 11c from the output part 12b1 and 12c1-side ends. As a result, the currents outputted from the semiconductor chips 30a and 30d disposed at positions closest to the terminal bonding region 12a6 pass through the vertical connecting parts 12b4 and 12c4 and the horizontal connecting parts 12b3 and 12c3 before reaching the output parts 12b1 and 12c1 of the wiring boards 12b and 12c. That is, the current paths taken by the currents outputted from the semiconductor chips 30a and 30d to reach the output parts 12b1 and 12c1 of the wiring boards 12b and 12c are made longer. This means that the difference between this current path and the current path of the currents outputted from the semiconductor chips 30c and 30f disposed at positions farthest from the terminal bonding region 12a6 to the output parts 12b1 and 12c1 of the wiring boards 12b and 12c becomes smaller. Accordingly, it is possible to suppress current imbalances that occur between the semiconductor chips 30a to 30c and 30d to 30f, which are connected in parallel, due to the distances at which the chips are disposed from the terminal bonding region 12a6. As a result, non-uniformity in the loss on each current path is suppressed, the life of the semiconductor device 1 is extended, and the reliability of the semiconductor device 1 is improved.

As described above, by forming the slits 12b5 and 12c5 between the vertical connecting parts 12b4 and 12c4 and the wiring parts 12b2 and 12c2 in the wiring boards 12b and 12c, the currents outputted from the semiconductor chips 30a and 30d are caused take a detour, which makes the current paths longer. It is desirable for the slits 12b5 and 12c5 to have lengths that make all of the current paths that pass through the semiconductor chips 30a to 30c and 30d to 30f as equal as possible. The lengths of such slits 12b5 and 12c5 may extend from the short side 11d-side ends of the vertical connecting parts 12b4 and 12c4 to positions corresponding to any of the semiconductor chips 30a to 30c and 30d to 30f. As a specific example, the lengths of the slits 12b5 and 12c5 preferably extend from the short side 11d-side ends of the vertical connecting parts 12b4 and 12c4 toward the short side 11b beyond the semiconductor chips 30a and 30d that are closest to the terminal bonding region 12a6.

The slits 12b5 and 12c5 do not need to be straight in order to extend the current paths. As examples, the slits 12b5 and 12c5 may be L-shaped, arc-shaped, or shaped like cranks in plan view. The slits 12b5 and 12c5 are not necessarily parallel to the long sides 11a and 11c. The slits 12b5 and 12c5 may be inclined by about ±30° with respect to the long sides 11a and 11c.

First Modification

Figure 10:
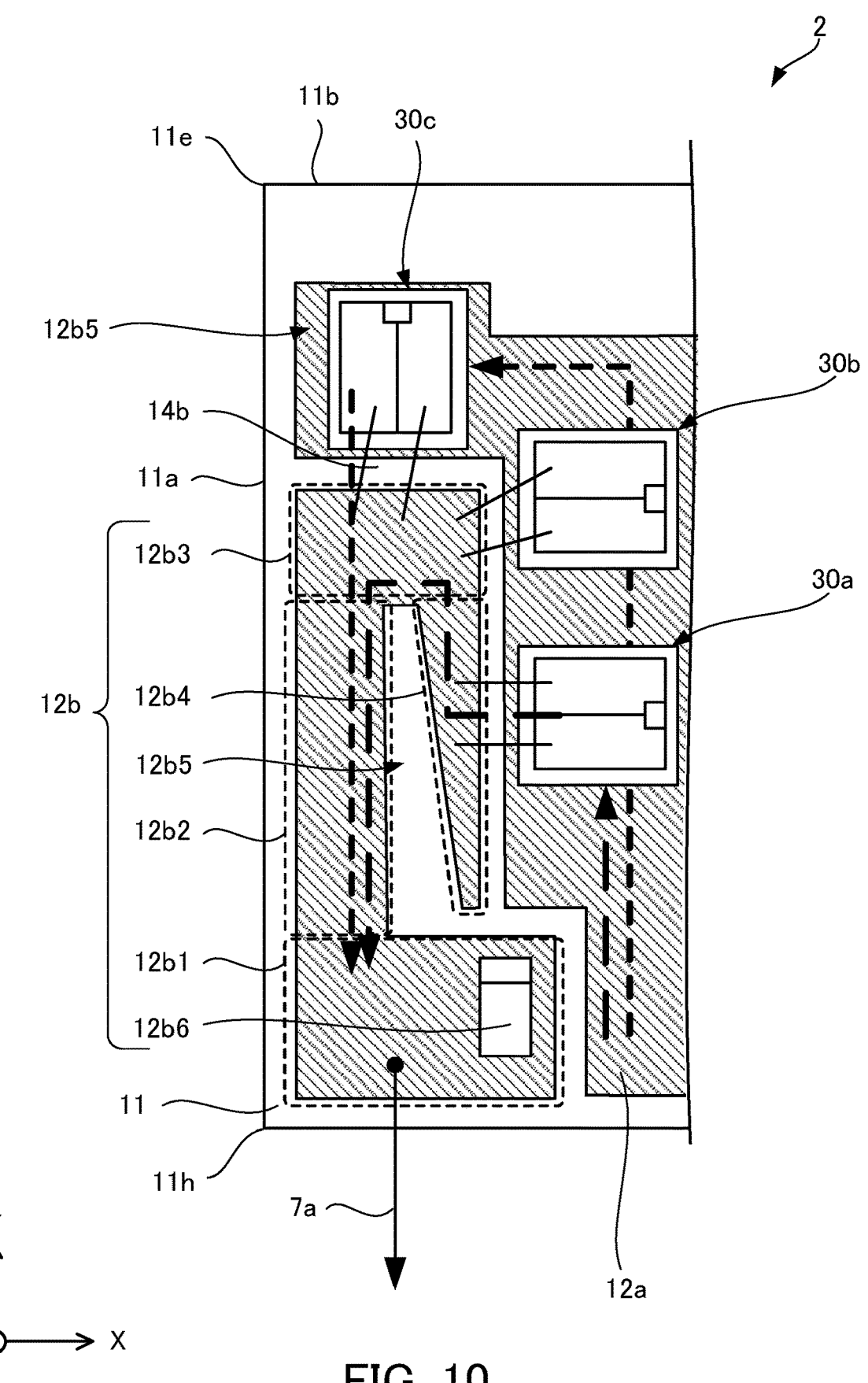
FIG. 10 is a plan view of a semiconductor unit (upper arm portion) included in the semiconductor device according to a first modification to the embodiment.

A semiconductor unit 2 according to a first modification to the above embodiment will now be described with reference to FIG. 10. FIG. 10 is a plan view of a semiconductor unit (upper arm portion) included in the semiconductor device according to a first modification to the embodiment.

In the semiconductor unit 2 of the first modification, the width (in the ±X direction) of the vertical connecting part 12b4 in the semiconductor unit 2 depicted in FIG. 7 gradually narrows in the −Y direction. The amount of current inputted into the vertical connecting part 12b4 from the semiconductor chips 30a and 30b also increases in the +Y direction. Due to this, the width of the vertical connecting part 12b4 is varied. By doing so, the area of the wiring board 12b may be reduced, which makes it possible to reduce cost. Note that although the wiring board 12b has been described here, the width of the vertical connecting part 12c4 may similarly vary for the wiring board 12c.

Second Modification

Figure 11:
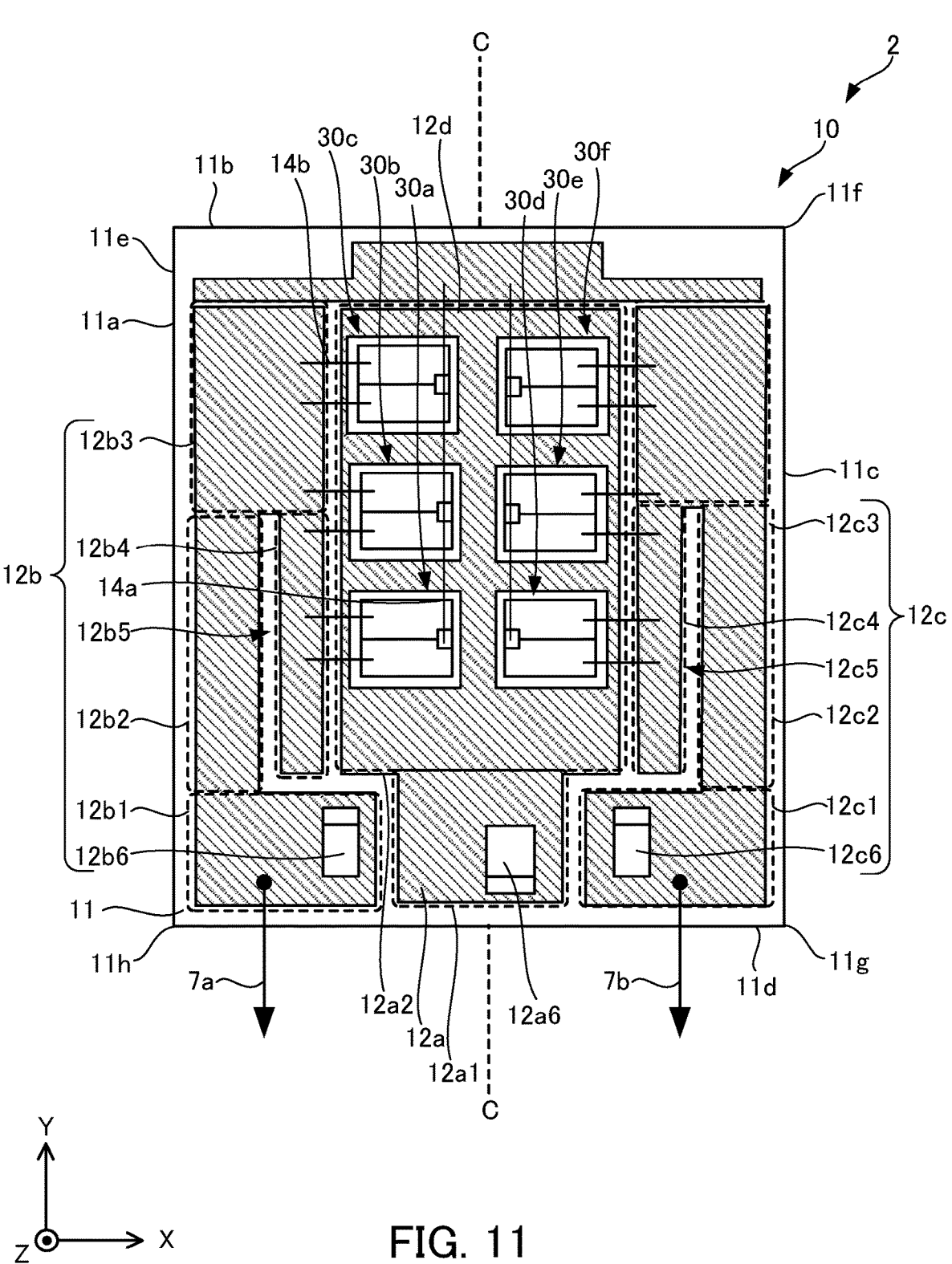
FIG. 11 is a plan view of a semiconductor unit (upper arm portion) included in a semiconductor device according to a second modification to the above embodiment.

A semiconductor unit 2 included in a semiconductor device 1 according to a second modification will now be described with reference to FIG. 11. FIG. 11 is a plan view of a semiconductor unit (upper arm portion) included in a semiconductor device according to a second modification to the above embodiment.

The wiring board 12a included in the semiconductor unit 2 according to the second modification has the semiconductor chips 30a to 30c and 30d to 30f laid out in two rows on the chip bonding part 12a2 from the wiring board 12a of the semiconductor unit 2 according to the above embodiment so as to avoid the protruding parts 12a3 and 12a4.

The wiring board 12a in the second modification includes the input part 12a1 and the chip bonding part 12a2. The chip bonding part 12a2 is rectangular in shape in plan view. The chip bonding part 12a2 is integrally formed with the input part 12a1 and extends in parallel with the long sides 11a and 11c as far as the wiring board 12d on the short side 11b side. The semiconductor chips 30a to 30c and 30e to 30f are laid out in two rows in the chip bonding part 12a2 so that the respective control electrodes 31 face each other.

The wiring board 12b is provided on the long side 11a-side of the wiring board 12a. The wiring board 12b extends close to the long side 11a from the short side 11d to the wiring board 12d along the long side 11a of the front surface of the insulating board 11. The wiring board 12b includes the output part 12b1, the wiring part 12b2, the horizontal connecting part 12b3, and the vertical connecting part 12b4. Out of these, the output part 12b1, the wiring part 12b2, and the vertical connecting part 12b4 are the same as in the embodiment described above.

The horizontal connecting part 12b3 is rectangular in shape in plan view, and is integrally formed with the wiring part 12b2. The width in the ±X direction of the horizontal connecting part 12b3 is wider than the width in the same direction of the wiring part 12b2. This means that the horizontal connecting part 12b3 is connected to the wiring part 12b2 on the short side 11d side and extends from the long side 11a as far as the chip bonding part 12a2 of the wiring board 12a. The −Y direction (short side 11d) side of the horizontal connecting part 12b3 is connected to the wiring part 12b2 and the vertical connecting part 12b4. The +Y direction (short side 11*b*) side of the horizontal connecting part 12*b*3 extends to the wiring board 12*d*.

In the semiconductor unit 2, even when the wiring boards 12*a* and 12*b* have the shapes described above, the vertical connecting parts 12*b*4 and 12*c*4 have the slits 12*b*5 and 12*c*5 formed along the long sides 11*a* and 11*c* from the output part 12*b*1 and 12*c*1 ends. By doing so, the currents outputted from the semiconductor chips 30*a* and 30*d* disposed at positions closest to the terminal bonding regions 12*a*6 pass through the vertical connecting parts 12*b*4 and 12*c*4 and the horizontal connecting parts 12*b*3 and 12*c*3 before reaching the output parts 12*b*1 and 12*c*1 of the wiring boards 12*b* and 12*c*. That is, the current paths of the currents outputted from the semiconductor chips 30*a* and 30*d* that reach the output parts 12*b*1 and 12*c*1 of the wiring boards 12*b* and 12*c* are made longer. This means that the difference between these current paths and the current paths of the currents outputted from the semiconductor chips 30*c* and 30*f* disposed farthest from the terminal bonding region 12*a*6 to the output parts 12*b*1 and 12*c*1 of the wiring boards 12*b* and 12*c* becomes smaller. Accordingly, it is possible to suppress current imbalances between the semiconductor chips 30*a* to 30*c* and 30*d* to 30*f*, which are connected in parallel, due to the distances at which the chips are disposed from the terminal bonding region 12*a*6. As a result, non-uniformity in the loss on each current path is suppressed, the life of the semiconductor device 1 is extended, and the reliability of the semiconductor device 1 is improved.

The shape and layout of the wiring boards 12*a* to 12*d* of the insulated circuit board 10 included in the semiconductor unit 2 that is the second modification are also symmetrical with respect to the center line C depicted in FIG. 11. In addition, the semiconductor chips 30*a* to 30*c* and 30*d* to 30*f* disposed on the wiring board 12*a* are laid out so as to be symmetrical with respect to the center line C depicted in FIG. 11.

According to the present disclosure, it is possible to suppress current imbalances between a plurality of semiconductor chips that are connected in parallel, to extend the life of a semiconductor device, and to suppress a drop in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a plurality of first semiconductor chips, each including an input electrode on a rear surface and an output electrode on a front surface thereof; and
a first insulated circuit board that is rectangular, and has a first side, a second side, a third side, and a fourth side successively adjacently disposed in this order, the first insulated circuit board including a first input wiring board extending in a first direction parallel to a direction in which the first and the third sides extend, and two first output wiring boards extending in the first direction, wherein the first input wiring board includes a first input region electrically connected to an input terminal and a first chip bonding region to which the plurality of first semiconductor chips are bonded, the first input region being located closer to the fourth side of the first insulated circuit board than is the first chip bonding region, the two first output wiring boards are disposed at opposite sides in a second direction perpendicular to the first direction and parallel to a direction in which the second and fourth sides extend, such that the first input wiring board is sandwiched between the two first output wiring boards, each first output wiring board including a first output region electrically connected to a first output terminal and a first connection wiring region electrically connected to the output electrodes of the plurality of first semiconductor chips, the first output region being located closer to the fourth side of the first insulated circuit board than is the first connection wiring region, and the first connection wiring region has a first slit extending in the first direction from the first output region toward the second side of the first insulated circuit board.

2. The semiconductor device according to claim 1, wherein
the first connection wiring region of each first output wiring board has a first vertical connection wiring part and a first wiring part that each extend along the first slit and that are located across the first slit, the first vertical connection wiring part facing the first input wiring board, and
in the second direction, a width of the first vertical connection wiring part is narrower than a width of the first wiring part.

3. The semiconductor device according to claim 2, wherein the width of the first vertical connection wiring part of each first output wiring board widens in the first direction from the fourth side toward the second side of the first insulated circuit board.

4. The semiconductor device according to claim 1, wherein
the first input wiring board further includes first and second protruding regions at positions closer to the second side than to the fourth side of the first insulated circuit board, the first and second protruding regions each having one of the plurality of first semiconductor chips thereon and protruding toward a respective one of the first side and the third side of the first insulated circuit board, and
each first output wiring board is adjacent to a corresponding one of the protruding regions, such that the first connection region is sandwiched between the corresponding one of the protruding regions and the first output region in the first direction.

5. The semiconductor device according to claim 1, further comprising a first arm portion and a second arm portion adjacent to the first arm portion, wherein
the first arm portion includes the plurality of first semiconductor chips and the first insulated circuit board,
the second arm portion includes:
a plurality of second semiconductor chips which each include an input electrode on a rear surface and an output electrode on a front surface thereof, and
a second insulated circuit board that is rectangular and has a fifth side, a sixth side, a seventh side, and an eighth side successively adjacently disposed in this order, the second insulated circuit board including a second output wiring board and a second input wiring board that each extend in a third direction parallel to a direction in which the fifth and seventh sides extend and are adjacent to each other in a fourth direction that is perpendicular to the third direction and is parallel to a direction in which the sixth and eighth sides extend, the second input wiring board includes a second input region electrically connected to the first output region and a second chip bonding region to which the plurality of second semiconductor chips are bonded, the second input region being located closer to the sixth side than to the eighth side of the second insulated circuit board, the second chip bonding region facing the second output wiring board, the second output wiring board includes a second output region electrically connected to a second output terminal, and a second connection wiring region electrically connected to the output electrodes of the plurality of second semiconductor chips, the second output region being located closer to the sixth side of the second insulated circuit board than is the second connection wiring region, and the second connection wiring region has a second slit extending in the third direction from the second output region toward the eighth side of the second insulated circuit board.

6. The semiconductor device according to claim 5, wherein the second arm portion is adjacent to the first arm portion such that the sixth side of the second insulated circuit board faces the fourth side of the first insulated circuit board, and the first input region, the first output region, and the second output region are positioned at a boundary line between the fourth side and the sixth side.

7. The semiconductor device according to claim 6, wherein the first output region of each first output wiring board and the second input region of the second input wiring board face each other.

8. The semiconductor device according to claim 7, wherein the first output region and the second input region are electrically and directly connected by a wiring member.

9. The semiconductor device according to claim 6, wherein the first input region of the first input wiring board and the second output region of the second output wiring board face each other.

10. The semiconductor device according to claim 9, wherein the second output wiring board extends in the third direction to face the plurality of second semiconductor chips.

11. The semiconductor device according to claim 10, wherein the second connection wiring region of the second output wiring board has a second vertical connection wiring part and a second wiring part that each extend along the second slit and are located across the second slit, the second vertical connection wiring part being closer to the second input wiring board than is the second wiring part, and in the fourth direction, a width of the second vertical connection wiring part is narrower than a width of the second wiring part.

12. The semiconductor device according to claim 5, wherein the second input wiring board is formed in a U shape in a plan view of the semiconductor device so as to surround the second output wiring board along the fifth side, the eighth side, and the seventh side of the second insulated circuit board.

13. The semiconductor device according to claim 12, wherein the plurality of second semiconductor chips face at least one of the fifth side, the seventh side, or the eighth side of the second insulated circuit board.

14. The semiconductor device according to claim 13, wherein the plurality of second semiconductor chips each further include a control electrode on a side portion of the front surface, and the plurality of second semiconductor chips is disposed on the second input wiring board such that each of the control electrodes is located away from the second output wiring board.

15. The semiconductor device according to claim 14, further comprising a second control wiring board adjacent to the eighth side of the second insulated circuit board, wherein the plurality of second semiconductor chips are arranged in the third direction from the sixth side toward the eighth side of the second insulated circuit board to face the second output wiring board, and the second control wiring board and the control electrodes of the plurality of second semiconductor chips are electrically connected by a second control wiring member.

16. The semiconductor device according to claim 5, wherein the first arm portion is provided in plurality, and the second arm portion is provided in plurality.

17. The semiconductor device according to claim 1, wherein the plurality of first semiconductor chips each further includes a control electrode on a side portion of the front surface, and the plurality of first semiconductor chips is disposed on the first input wiring board such that each of the control electrodes is located away from each first output wiring board.

18. The semiconductor device according to claim 17, further comprising a first control wiring board adjacent to the second side of the first insulated circuit board, wherein the plurality of first semiconductor chips are arranged in the first direction from the fourth side toward the second side of the first insulated circuit board, to face the two first output wiring boards, and the first control wiring board and the control electrode are electrically connected by a first control wiring member.

19. A semiconductor device, comprising:

a first arm portion; and a second arm portion adjacent to the first arm portion, wherein the first arm portion includes:

a plurality of first semiconductor chips, each including an input electrode on a rear surface and an output electrode on a front surface thereof; and a first insulated circuit board that is rectangular, and has a first side, a second side, a third side, and a fourth side successively adjacently disposed in this order, the first insulated circuit board including a first input wiring board extending in a first direction parallel to a direction in which the first and the third sides extend, and two first output wiring boards extending in the first direction, the first input wiring board includes a first input region electrically connected to an input terminal and a first chip bonding region to which the plurality of first semiconductor chips are bonded, the first input region being located closer to the fourth side of the first insulated circuit board than is the first chip bonding region, the two first output wiring boards are disposed at opposite sides in a second direction perpendicular to the first direction and parallel to a direction in which the second and fourth sides extend, such that the first input wiring board is sandwiched between the two first output wiring boards, each first output wiring board including a first output region electrically connected to a first output terminal and a first connection wiring region electrically connected to the output electrodes of the plurality of first semiconductor chips, the first output region being located closer to the fourth side of the first insulated circuit board than is the first connection wiring region, the second arm portion includes:

a plurality of second semiconductor chips which each include an input electrode on a rear surface and an output electrode on a front surface thereof, and a second insulated circuit board that is rectangular and has a fifth side, a sixth side, a seventh side, and an eighth side successively adjacently disposed in this order, the second insulated circuit board including a second output wiring board and a second input wiring board that each extend in a third direction parallel to a direction in which the fifth and seventh sides extend and are adjacent to each other in a fourth direction that is perpendicular to the third direction and is parallel to a direction in which the sixth and eighth sides extend, the second input wiring board includes a second input region electrically connected to the first output region and a second chip bonding region to which the plurality of second semiconductor chips are bonded, the second input region being located closer to the sixth side than to the eighth side of the second insulated circuit board, the second chip bonding region facing the second output wiring board, the second output wiring board includes a second output region electrically connected to a second output terminal, and a second connection wiring region electrically connected to the output electrodes of the plurality of second semiconductor chips, the second output region being located closer to the sixth side of the second insulated circuit board than is the second connection wiring region, the second arm portion is adjacent to the first arm portion such that the sixth side of the second insulated circuit board faces the fourth side of the first insulated circuit board, and the first input region, the first output region, and the second output region are positioned adjacent to a boundary line between the fourth side and the sixth side.

20. The semiconductor device according to claim 19, wherein the first input wiring board is formed in a T shape in a plan view of the semiconductor device.

21. The semiconductor device according to claim 19, wherein the second connection wiring region is sandwiched in the third direction between a portion of the second chip bonding region in which at least one of the plurality of second semiconductor chips is bonded, and the second output region.

22. A semiconductor device, comprising:

a first arm portion, and a second arm portion adjacent to the first arm portion, wherein the first arm portion includes:

a plurality of first semiconductor chips, each including an input electrode on a rear surface and an output electrode on a front surface thereof; and a first insulated circuit board that is rectangular, and has a first side, a second side, a third side, and a fourth side successively adjacently disposed in this order, the first insulated circuit board including a first input wiring board extending in a first direction parallel to a direction in which the first and the third sides extend, and a first output wiring board extending in the first direction, being adjacent to the first input wiring board in a second direction perpendicular to the first direction and parallel to a direction in which the second and fourth sides extend, and being closer to one of the first side or the third side of the first insulated circuit board than is the first input wiring board, wherein the first input wiring board is formed in a T shape in a plan view of the semiconductor device and includes a first input region electrically connected to an input terminal and a first chip bonding region to which the plurality of first semiconductor chips are bonded, the first input region being located closer to the fourth side of the first insulated circuit board than is the first chip bonding region, the first output wiring board extends in the first direction, to face the plurality of first semiconductor chips and includes a first output region electrically connected to a first output terminal and a first connection wiring region electrically connected to the output electrodes of the plurality of first semiconductor chips, the first output region being located closer to the fourth side of the first insulated circuit board than is the first connection wiring region, the input terminal being sandwiched between the the second arm portion includes:

a plurality of second semiconductor chips which each include an input electrode on a rear surface and an output electrode on a front surface thereof, and a second insulated circuit board that is rectangular and has a fifth side, a sixth side, a seventh side, and an eighth side successively adjacently disposed in this order, the second insulated circuit board including a second output wiring board and a second input wiring board that each extend in a third direction parallel to a direction in which the fifth and seventh sides extend and are adjacent to each other in a fourth direction that is perpendicular to the third direction and is parallel to a direction in which the sixth and eighth sides extend, the second input wiring board includes a second input region electrically connected to the first output region and a second chip bonding region to which the plurality of second semiconductor chips are bonded, the second input region being located closer to the sixth side than to the eighth side of the second insulated circuit board, the second chip bonding region facing the second output wiring board, the second output wiring board includes a second output region electrically connected to a second output terminal, and a second connection wiring region electrically connected to the output electrodes of the plurality of second semiconductor chips, the second output region being located closer to the sixth side of the second insulated circuit board than is the second connection wiring region, and the second chip bonding region of the second input wiring board is formed in a U shape in a plan view of the semiconductor device so as to surround the second output wiring board along the fifth side, the eighth side, and the seventh side of the second insulated circuit board, wherein the first output wiring board includes two first output wiring boards, each of the two first output wiring boards including a terminal bonding region to which the output terminal is bonded, the two first output wiring boards are located between the first input wiring board and the first side and between the first input wiring board and the third side, respectively, and the first input region includes a terminal bonding region to which the input terminal is bonded, the terminal bonding region of the first input region being located, in the second direction, between the first output regions of the two first output wiring boards.

23. The semiconductor device according to claim 22, wherein the second output region includes a terminal bonding region to which the second output terminal is bonded, the terminal bonding region of the second output region being located between the first output regions of the two first output wiring boards when viewed from the first direction.

\* \* \* \* \*